(12) United States Patent
Sivaramakrishnan et al.

(10) Patent No.: US 9,556,522 B2
(45) Date of Patent: Jan. 31, 2017

(54) HIGH THROUGHPUT MULTI-WAFER EPITAXIAL REACTOR

(71) Applicant: Crystal Solar, Incorporated, Santa Clara, CA (US)

(72) Inventors: Visweswaren Sivaramakrishnan, Cupertino, CA (US); Kedarnath Sangam, Sunnyvale, CA (US); Tirunelveli S. Ravi, Saratoga, CA (US); Andrzej Kaszuba, San Jose, CA (US); Quoc Vinh Truong, San Leandro, CA (US)

(73) Assignee: Crystal Solar Incorporated, Santa Clara, CA (US)

( * ) Notice: Subject to any disclaimer, the term of this patent is extended or adjusted under 35 U.S.C. 154(b) by 0 days.

(21) Appl. No.: 14/196,609

(22) Filed: Mar. 4, 2014

(65) Prior Publication Data

US 2014/0295106 A1  Oct. 2, 2014

Related U.S. Application Data

(63) Continuation of application No. 13/664,332, filed on Oct. 30, 2012, now Pat. No. 8,663,753, which is a
(Continued)

(51) Int. Cl.
*C23C 16/00* (2006.01)
*C23C 16/48* (2006.01)
(Continued)

(52) U.S. Cl.
CPC ......... *C23C 16/481* (2013.01); *C23C 16/0209* (2013.01); *C23C 16/455* (2013.01);
(Continued)

(58) Field of Classification Search
CPC ........ C23C 16/46; C23C 16/54; C23C 16/481; C23C 16/0209; C23C 16/455; C23C 16/463; C30B 25/105; C30B 29/06; C30B 29/12
(Continued)

(56) References Cited

U.S. PATENT DOCUMENTS 3,576,679 A   4/1971   Shipps
3,658,585 A   4/1972   Folkmann et al.
(Continued)

FOREIGN PATENT DOCUMENTS

JP   04-183863   6/1992
JP   10-233370   9/1998
(Continued)

OTHER PUBLICATIONS

International Search Report and Written Opinion Issued Aug. 27, 2015 for PCT/US2015/035698.
(Continued)

*Primary Examiner* — Kelly M Gambetta
(74) *Attorney, Agent, or Firm* — David H. Jaffer; Pillsbury Winthrop Shaw Pittman LLP

(57) ABSTRACT

An epitaxial reactor enabling simultaneous deposition of thin films on a multiplicity of wafers is disclosed. During deposition, a number of wafers are contained within a wafer sleeve comprising a number of wafer carrier plates spaced closely apart to minimize the process volume. Process gases flow preferentially into the interior volume of the wafer sleeve, which is heated by one or more lamp modules. Purge gases flow outside the wafer sleeve within a reactor chamber to minimize wall deposition. In addition, sequencing of the illumination of the individual lamps in the lamp module may further improve the linearity of variation in deposition rates within the wafer sleeve. To improve uniformity, the direction
(Continued)

of process gas flow may be varied in a cross-flow configuration. Combining lamp sequencing with cross-flow processing in a multiple reactor system enables high throughput deposition with good film uniformities and efficient use of process gases.

17 Claims, 21 Drawing Sheets

Related U.S. Application Data continuation of application No. 12/392,448, filed on Feb. 25, 2009, now Pat. No. 8,298,629.

(51) Int. Cl.
| | |
|---|---|
| C23C 16/458 | (2006.01) |
| C23C 16/46 | (2006.01) |
| C23C 16/54 | (2006.01) |
| C30B 25/10 | (2006.01) |
| C30B 25/12 | (2006.01) |
| C30B 29/06 | (2006.01) |
| C23C 16/02 | (2006.01) |
| C23C 16/455 | (2006.01) |

(52) U.S. Cl.
CPC .......... *C23C 16/4582* (2013.01); *C23C 16/46* (2013.01); *C23C 16/463* (2013.01); *C23C 16/54* (2013.01); *C30B 25/105* (2013.01); *C30B 25/12* (2013.01); *C30B 29/06* (2013.01)

(58) Field of Classification Search
USPC .............................. 427/585, 248.1; 118/715
See application file for complete search history.

(56) References Cited

U.S. PATENT DOCUMENTS

| | | | |
|---|---|---|---|
| 4,389,273 | A | 6/1983 | Bloem et al. |
| 5,201,996 | A | 4/1993 | Gmitter |
| 5,232,868 | A | 8/1993 | Hayashi et al. |
| 5,493,987 | A | 2/1996 | McDiarmid et al. |
| 5,683,518 | A * | 11/1997 | Moore ................ C23C 16/4404 118/50.1 |
| 5,851,299 | A | 12/1998 | Cheng et al. |
| 5,906,680 | A | 5/1999 | Meyerson |
| 6,001,175 | A | 12/1999 | Maruyama et al. |
| 6,129,048 | A | 10/2000 | Sullivan |
| 6,189,482 | B1 | 2/2001 | Zhao et al. |
| 6,197,121 | B1 | 3/2001 | Gurary et al. |
| 6,262,393 | B1 | 7/2001 | Imai et al. |
| 6,368,404 | B1 | 4/2002 | Gurary et al. |
| 6,399,510 | B1 | 6/2002 | Riley et al. |
| 8,298,629 | B2 | 10/2012 | Sivaramakrishnan et al. |
| 8,656,860 | B2 | 2/2014 | Kamian et al. |
| 2001/0007246 | A1 | 7/2001 | Ueda et al. |
| 2002/0102859 | A1 | 8/2002 | Yoo |
| 2003/0056720 | A1 | 3/2003 | Dauelsberg |
| 2009/0211707 | A1 | 8/2009 | Chao et al. |
| 2009/0227063 | A1 | 9/2009 | Ravi |
| 2009/0230019 | A1 * | 9/2009 | Yang .................. C23C 16/4587 206/711 |
| 2010/0092697 | A1 | 4/2010 | Poppe et al. |
| 2010/0092698 | A1 | 4/2010 | Poppe et al. |
| 2010/0108130 | A1 | 5/2010 | Ravi |
| 2010/0108134 | A1 | 5/2010 | Ravi |
| 2010/0209626 | A1 | 8/2010 | He et al. |
| 2010/0263587 | A1 | 10/2010 | Sivaramakrishnan et al. |
| 2010/0267245 | A1 | 10/2010 | Kamian et al. |
| 2011/0006040 | A1 | 1/2011 | Savas et al. |
| 2011/0056532 | A1 | 3/2011 | Ravi |
| 2012/0000511 | A1 | 1/2012 | Gee et al. |
| 2012/0085278 | A1 | 4/2012 | Moslehi et al. |
| 2013/0032084 | A1 | 2/2013 | Sivaramakrishnan et al. |

FOREIGN PATENT DOCUMENTS

| | | |
|---|---|---|
| JP | 2001-187332 | 7/2001 |
| JP | 2006-019461 A | 1/2006 |

OTHER PUBLICATIONS

Kerschaver, et al., "Back-Contact Solar Cells: A Review" Prog, Photovoltaic: Res, Applic., 2006, vol. 14, pp. 107-123.
Bau, S., "High-Temperature CVD Silicon Films for Crystaline Silicon Thin-Film Solar Cells" Ph.D. Disseration, University of Konstanz 2003 (see p. 18, Fig. 3.4) available at: http://hops.ub.uni-konstanz.de/handle/urn:nbn:de:bsz:352-opus-11305.
Brendel, et al. "15.4%-efficient and 25um-thin Crystalline Si Solar Cell From Layer Transfer Using Porous Silicon", Phys. Stat. Sol. (a) 197, No. 2, pp. 497-501 (2003).
Buelow, et al., "Destruction of Energetic Materials in Supercritical Water", Jun. 25, 2002, retrieved from: http://www.dtic.mil/cgi-bin/GetTRDoc?AD=ADA 408762, pp. 146-147.
Popov, et al., "Heat and Mass Transfer in an Expitaxial Reactor of the Vertical Type", Journal of Engineering Physics and Thermodynamics, 56:6, pp. 653-658, Jun. 1989.
International Search Report and Written Opinion dated May 4, 2010 for International PCT Patent Application Serial No. PCT/US2010/025449.
Riepe, S., et al.; "Silicon Material Technology and Evaluation Center (SIMTEC) at Fraunhoffer ISE—Achievements and Visions," presented at the 23$^{rd}$ European Photovoltaic Solar Energy Conference and Exhibition, Sep. 1-5, 2008, Valencia, Spain; 6 pages.
Brendel, R., et al., EMRS 2007 Strasbourg, Conference presentation D-9-1. Available on-line at http://www.isfh.de/isntitut_solarforschung/files/thin_film_si_wafer_cell.pdf.
Beaucarne, G., Duerinckx, F., Kuzma, I., Van Nieuwenhuysen, K., Kim, H.J., Poortmans, J., "*Expitaxial thin-film Si solar cells,*" Thin Solid Films 511-512 (2006) pp. 533-542.
Reber, S., et al., "Progress in High-Temperature Silicon Epitaxy Using the RTCVD160 Processor," 19$^{th}$ European Photovoltaic Solar Energy Conference, Jun. 7-11, 2004, Paris, France; pp. 471-474.
Hurrle, A., "High-Throughput Continuous CVD Reactor for Silicon Deposition," 19$^{th}$ European Photovoltaic Solar Energy Conference, Jun. 7-11, 2004, Paris France; pp. 459-462.

* cited by examiner

HIGH THROUGHPUT MULTI-WAFER EPITAXIAL REACTOR

RELATED APPLICATIONS

This application is a continuation of, and claims the benefit of U.S. patent application Ser. No. 13/664,332 filed Oct. 30, 2012, which is a continuation of U.S. patent application Ser. No. 12/392,448 filed Feb. 25, 2009, now U.S. Pat. No. 8,298,629, which are incorporated in their entirety herein by reference.

BACKGROUND OF THE INVENTION

Field of the Invention

This invention relates generally to the field of chemical vapor deposition (CVD) reactors for thin film deposition, especially of epitaxial films, and more particularly to CVD reactors employing one or more lamp-heated reactors and a travelling wafer sleeve exposed to the lamps, absorbing the lamp radiation, and mounting multiple wafers and defining process gas flow within the wafer sleeve.

Description of the Related Art

Epitaxial reactors for use in depositing thin films on wafers by chemical vapor deposition (CVD) may be categorized in terms of their method of heating the wafers, their overall arrangement of the wafers within the reaction chamber or chambers, and the overall tool architecture, including the number of reaction chambers and whether additional chambers for preheat and cool down are configured at the entrance and exit of the system, respectively. FIGS. 1-3 illustrate three different types of prior art epitaxial reactors, categorizing each in terms of these various design aspects.

A prior art pancake-type epitaxial reactor 100 is illustrated in the schematic side cross-sectional view of FIG. 1. The wafers 110 on which epitaxial films are to be deposited are supported by a susceptor 111. Typical susceptors may be composed of graphite with a silicon carbide coating. The susceptor 111 is mounted within a reactor chamber 101 into which one or more process gases 102 enter through an inlet line 103 to a gas passageway included within a stem which also provides mechanical support for rotary motion 140 of the susceptor 111. Electrical eddy currents flowing within the resistive graphite material of the susceptor 111 heat the susceptor 111 and, by conduction, the wafers 110 supported thereon. These eddy currents are induced by a set of RF induction coils 112 mounted beneath the susceptors 111. Process gases 105 enter the reactor chamber 101 through an outlet 104 from the gas passageway in the stem and then flow across the surface of the heated wafers 110. Exhaust gases 115, comprising both product gases from the epitaxial reaction as well as unused reactant gases, are pumped out of the reactor chamber 101 through outlet openings 114.

Pancake-type epitaxial reactors 100 have the ability to deposit thick films and dual layers with non-uniformities in the range of 4% in thickness and 7% in resistivity with sharp transitions and low metals contamination. The rotary motion 140 of the susceptor 111 enhances deposition uniformity. Key disadvantages of this type of epitaxial reactor are low throughput, high gas consumption, wafer warpage, and worse uniformities than other types of prior art epitaxial reactors (see FIGS. 2 and 3). Another important disadvantage is the need for frequent cleaning of the inner surfaces of the reactor chamber 101 due to unwanted deposition of films on these surfaces. This unwanted deposition increases the cost of ownership due to higher process gas consumption and increased system downtime for maintenance and cleaning.

A prior art barrel type epitaxial reactor 200 is shown in the schematic side cross-sectional view of FIG. 2. In this type of reactor, wafers 210 on which epitaxial films are to be grown are mounted on a multi-sided graphite carrier 211, which is held within a reactor chamber 201 on a support 215 enabling rotary motion 240 to enhance uniformity during the deposition process. The graphite carrier 211 is heated by an array of lamps 202 contained within one or more reflector assemblies 203 which are mounted around, and outside of, the reactor chamber 201. Process gases 217 enter the reactor through inlet lines 216 and flow around the outside of the graphite carrier 211 as illustrated by arrows 220. Exhaust gases 205, comprising both product gases from the epitaxial reaction as well as unused reactant gases, are pumped out through an exhaust line 204. Some of the reactant gases 221 recirculate within the reactor chamber 201, increasing the usage efficiency of the reactant gases during the epitaxial deposition process.

Barrel-type epitaxial reactors have the advantages of good surface quality and slip performance, with typical thickness non-uniformities around 3% and resistivity non-uniformities around 4%. Throughputs can be higher than for the pancake type reactor. Some disadvantages are an inability to deposit dual layers and relatively high film resistivities. This type of reactor is currently the main type used in CMOS semiconductor manufacturing.

A third type of prior art epitaxial reactor is illustrated in FIG. 3, a Single/Mini-Batch™ lamp heated reactor 300. In this reactor 300, a single wafer 310 is processed within a reactor chamber comprising a lower metal portion 301 and a quartz dome 302, which are held together by a multiplicity of clamps 303. Typically, the pressures within the reactor chamber may be lower than for other types of epitaxial reactors. A wafer 310 being processed is supported by a carrier 311 which is mounted on a stem 315 extending into the reactor chamber. The stem 315 enables rotary motion 340 of the carrier 311 during the deposition process to enhance uniformity. Process gases 307 enter the reactor through an inlet line 350. The process gases 308 enter the reactor chamber near the level of the wafer 310. The wafer 310 is heated by light radiation from an array of lamps 330 mounted within a reflector assembly 331. Exhaust gases 306, comprising both product gases from the epitaxial reaction as well as unused reactant gases, are pumped out of the reactor chamber through an outlet opening 305.

The Single/Mini-Batch™ type of epitaxial reactor has a number of important advantages, including the ability to process wafers 310 with no need for a backside seal. Epitaxial films may be deposited with sharp dopant transitions, with low metals contamination, and with low thickness (1.5%) and resistivity (2%) non-uniformities. In addition, wafers up to 300 mm in diameter may be accommodated in the single wafer reactor chamber. Films with good surface quality and no slip may be deposited with throughputs as high as 8 to 24 wafers per hour. However, an important disadvantage of this type of reactor is the high film costs for thicker films where the throughputs drop due to the longer epitaxial deposition times required.

Epitaxial deposition is a process which was pioneered for use in the semiconductor industry for the manufacture of integrated circuits and discrete devices. Typically, a silicon-precursor gas such as silane is injected close to a hot crystalline silicon substrate to chemically vapor deposit a layer of silicon on the substrate, which is epitaxial with the silicon of the substrate. For these applications, in general, the final value of a fully processed wafer can be fairly high, in some cases, such as for microprocessors, in the tens of thousands of dollars per wafer. Thus, the economics of semiconductor manufacturing may support relatively higher costs for each processing step than would be the case for other types of semiconductor products such as photovoltaic (PV) solar cell wafers. For these other applications, the cost per process step must be relatively low since the final cost of a PV solar cell (typically about 150 mm square) may be in the range of ten dollars, orders of magnitude lower than for most fully processed semiconductor device wafers (typically 200 or 300 mm in diameter). On the other hand, some film characteristics for PV solar cell applications may be less stringent than for device wafers, in particular, the required film thickness and resistivity uniformities.

Epitaxial deposition of a thin-film solar cell has the disadvantage that epitaxial deposition is typically a relatively slow process in achieving good epitaxy but the semiconducting light absorbing layers in a solar cell need to be relatively thick. As a result, the deposition times for epitaxial solar cells are typically much longer than for the very thin epitaxial layers typical of modern electronic integrated circuits.

SUMMARY OF THE INVENTION

The present invention provides an improved design for an epitaxial reactor with higher throughput, a wafer sleeve containing a multiplicity of wafers within a small reaction volume to improve usage of process gases and minimize unwanted deposition on the reaction chamber walls, and increased lamp lifetimes through improved lamp temperature control. A high degree of control over film thickness and resistivity uniformities within and between wafers may be achieved in the present invention without the need for rotary or other types of wafer motion during the deposition process, thereby simplifying the design of the reactor chamber. The epitaxial reactor of the present invention may comprise one or more lamp modules which irradiate a wafer sleeve contained within a reactor frame which also supports the lamp modules. Alternative embodiments of the present invention may employ either resistive heating or inductive heating of the wafer sleeve, instead of radiant lamp heating.

In one aspect of the invention, each lamp module comprises a multiplicity of lamps, typically tungsten-halogen, which radiantly heat the wafer sleeve through an illumination window, typically quartz. On the far side of each lamp, away from the wafer sleeve, is a reflector assembly, typically gold-coated for maximum IR reflectivity and resistance to oxidation. The lamp module structure may be water cooled while each lamp within the lamp module may be air cooled by an array of openings behind each lamp which are connected to air plenums. This lamp cooling arrangement ensures proper hermetic sealing of the lamp at each end to preserve the pressure of the cooling air, as well as increasing the lamp lifetime through proper lamp temperature management. In one embodiment of the present invention described herein, two lamp modules are mounted on the reactor frame, wherein each lamp module irradiates the wafer sleeve supported within the reactor frame. In an alternative embodiment, a single lamp module is mounted on one side of the reactor frame, heating the wafer sleeve.

In another aspect of the invention, the wafer sleeve is an assembly comprising at least two carrier plates, onto each of which a number of wafers are mounted in good thermal contact with the flat inner surfaces of the carrier plates. The carrier plates are supported and held in a fixed close spacing by a pair of end caps. The outer surfaces of the carrier plates are heated by light from the lamp modules, which radiate through windows, preferably quartz. A preferred material for the carrier plates is silicon carbide due to the high absorptivity of silicon carbide for visible and infrared light.

The process gases for epitaxial deposition may be fed directly into the interior space of the wafer sleeve by a set of process gas inlet tubes on the top and bottom of the reactor frame. Also on the top of the reactor frame is a set of purge gas inlet tubes, typically supplying hydrogen gas into the volume within the reactor frame, but outside of the wafer sleeve. Thus, a minimum amount of purge gas is introduced into the outer portions of the reactor module, thereby minimizing the amount of undesirable deposition on surfaces outside of the interior of the reactor module. Deposition on the inner surfaces of the reactor module is further reduced by water cooling of the reactor module. A set of exhaust outlet lines extends out of the top and bottom of the reactor frame. The exhaust gases comprise the purge gas, products from the epitaxial reaction within the reactor module, and unused reactant gases.

In an epitaxial reactor in which the process gases are confined within a small region above the wafers, the percentage consumption of the process gases will be higher as the process gases flow from the inlet to the exhaust. This can cause the epitaxial deposition rate for wafers near the process gas inlet to be higher than for wafers nearer the exhaust outlet lines due to a reduction in the reactant gas concentration with increasing distance from the inlet.

Thus, another aspect of the present invention provides bi-directional flow of process gases, enabling a "cross-flow" epitaxial deposition process. In this approach, the process gases first flow in one direction, for example, downwards through the interior of the wafer sleeve for a predetermined period. The direction of the process gas is then reversed to the opposite direction, for example, upwards through the interior of the wafer sleeve for a similar predetermined period. This procedure can be repeated for a number of cycles during epitaxial deposition on a set of wafers contained within the wafer sleeve, thereby averaging out the deposition rates between the wafers at the top and bottom of the wafer sleeve. In addition, flow and exhaust can be setup from left to right and from right to left. In this arrangement, the gas flow is switched every 90 degrees thus closely simulating a rotary motion of the wafer during deposition.

In a first embodiment of the overall system of the present invention, the epitaxial reactor may be integrated within a system comprising a preheat chamber, a single epitaxial deposition reactor, and a cool down chamber. In a second embodiment, two or more epitaxial deposition reactors may be employed in series, and combined with a preheat chamber and a cool down chamber. In this second embodiment, the epitaxial reactors each deposits part of the desired final film thickness. The wafer sleeve then moves to the next reactor for another partial deposition. For example, in a system comprising a preheat chamber, three epitaxial reactors, and a cool down chamber, each of the epitaxial reactors could deposit approximately one third of the final desired film thickness. During deposition within each of the three epitaxial reactors, the cross-flow deposition process could be employed to enhance deposition uniformity. Thus, the deposition time per epitaxial reactor would be one third that required for the single epitaxial reactor in the first embodiment. Assuming that the preheat and cool down times are less than one third of the total deposition time, this second embodiment could provide a wafer throughput roughly three times higher than the throughput of the first embodiment.

In a further embodiment of the present invention, a number of epitaxial reactors may be employed in series, with differing flow directions to achieve the desired overall film uniformity without the need for cross-flow processing within any of the epitaxial reactors. This approach, which may be combined with a preheat chamber and a cool down chamber, enables simpler reactor chambers to be employed since each reactor would need piping for only unidirectional process gas and exhaust flows.

Since the wafer sleeve of the present invention is heated by an array of lamps, a method of lamp sequencing may be employed to further enhance film deposition uniformities. In this method, the variation in deposition rate along a direction corresponding to the process gas flows may be made nearly linear by activation of the heating lamps for various duty cycles less than 100%, thereby controlling the deposition rate through real-time control of the wafer temperatures in different parts of the wafer sleeves. Combining lamp sequencing with cross-flow processing could then enable relatively uniform overall deposition rates to be obtained within and between wafers.

DETAILED DESCRIPTION

Figure 1:
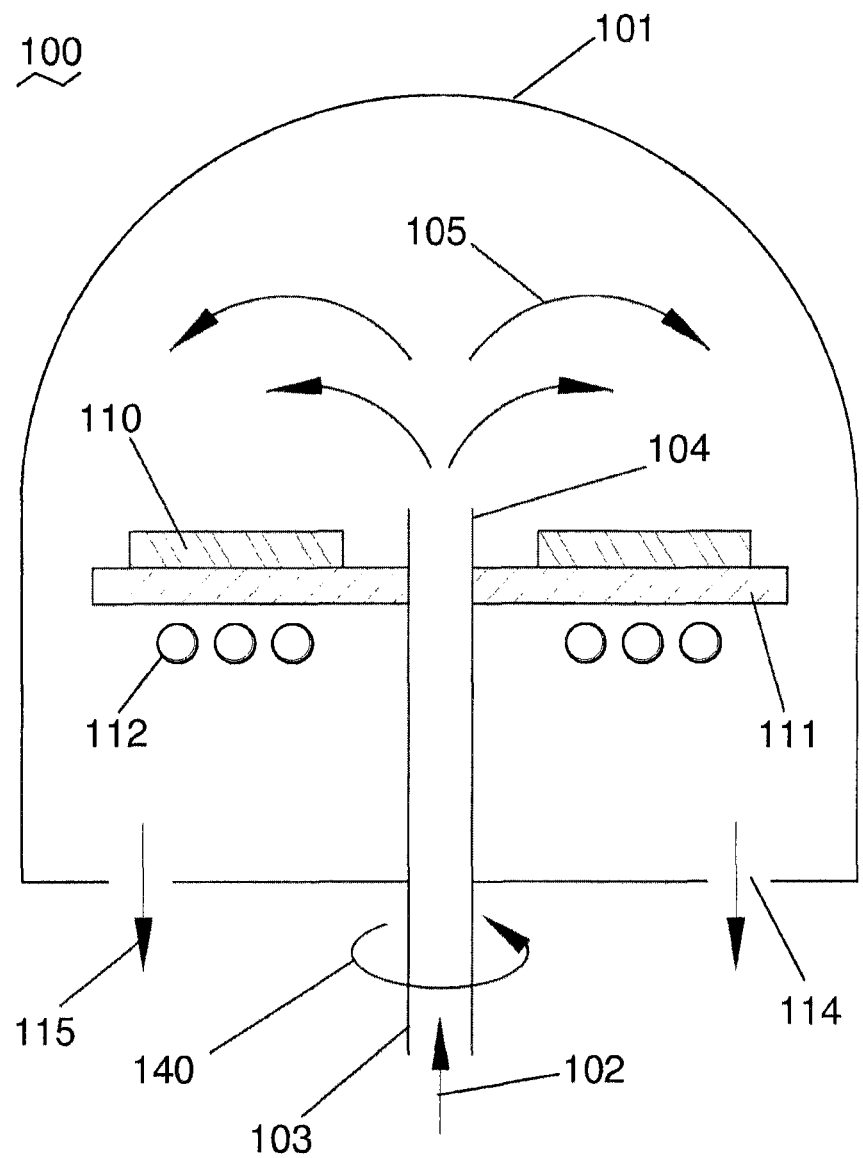
FIG. 1 is a schematic side cross-sectional view of a prior art pancake type epitaxial reactor.

One disadvantage of prior art epitaxial deposition systems for PV cell applications is low throughput, measured in wafers per hour. Thus, it would be desirable for an epitaxial reactor to process a large number of wafers in parallel with the minimum deposition time practical to still achieve the desired properties in the deposited films on PV solar cell wafers.

Accordingly, one aspect of the present invention includes an epitaxial reactor enabling the simultaneous deposition by chemical vapor deposition of films on a multiplicity of wafers, each supported by a carrier plate heated by an array of lamps mounted within a reflector assembly. The epitaxial reactor of the present invention comprises one or more lamp modules which illuminate a wafer sleeve contained within a reactor frame which also supports the lamp modules. The following figures describe the lamp module, wafer sleeve, and reactor frame separately. Next, the assembly of a reactor module is described, followed by the operation of the reactor module with respect to illumination, cooling, and process and purge gas flows. Various configurations for the wafer sleeve are discussed, followed by different embodiments comprising various numbers of reactors. Finally, a methodology for improving wafer-to-wafer deposition rates is discussed.

The overall reactor design can be summarized with respect to FIG. 14, which will be described later in more detail as will the other reactor parts. Wafers 920 are mounted on facing sides of two carrier plates 906 within an interior volume 907 of a wafer sleeve (alternately called a carrier) generally arranged with one principal side extending vertically and travelling horizontally to be stationarily placed within a reaction volume 1503 of the reactor for the deposition process. Two lamp modules 502 irradiate the outsides of the carrier plates 906 through windows 1200. The carrier plates 906 are made out of material, such as silicon carbide, which absorbs the visible and near infrared radiation of lamps and is heated by the radiation. Process gases, such as trichlorosilane and hydrogen, flow vertically through the internal volume 907 of the sleeve 900 to epitaxially deposit material such as silicon on the wafers 920. Typical reaction temperatures are typically in the range of 600 to 1200° C.

Lamp Module

One disadvantage of the prior art epitaxial reactors heated by incandescent lamps is the consumable cost associated with the lamps. Typically, expensive tungsten-halogen lamps are used due to their high infrared emission, making wafer heating more efficient. Tungsten-halogen lamps contain a coiled tungsten filament within a sealed tube containing a halogen gas. If the lamps are inadequately cooled, their lifetimes may be substantially reduced, constituting an additional variable cost for the wafer manufacturing process. Thus, it would be desirable to provide a level of lamp cooling which will enable lamp lifetimes to be extended, thereby reducing the amortized lamp costs per PV cell wafer. Accordingly, one aspect of the present invention provides a lamp module allowing increased lifetime of the lamps.

Figure 4:
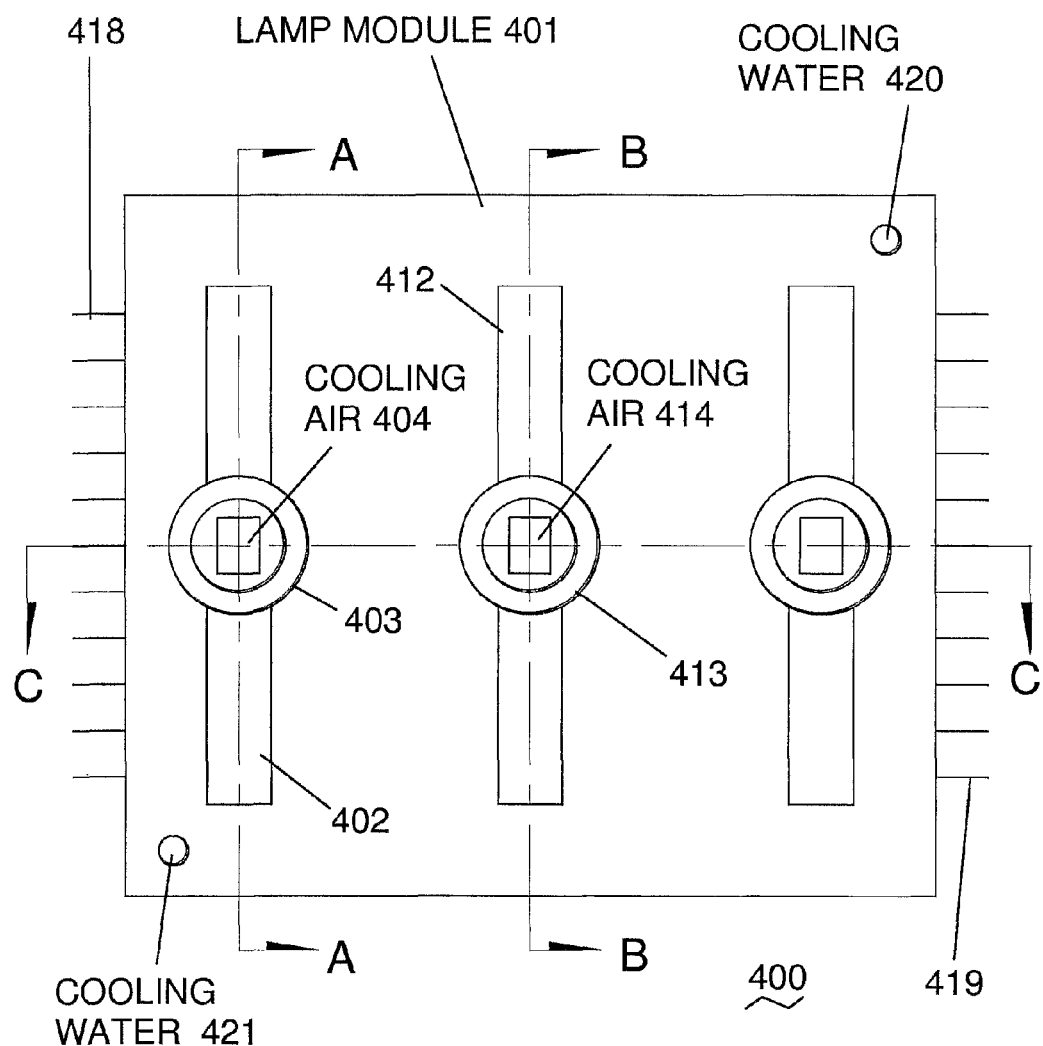
FIG. 4 is a schematic outer side view of a lamp module of the present invention.

The schematic outer side view of FIG. 4 shows a lamp module 400 of one embodiment of the present invention. A lamp module structure 401 may be attached to the reactor frame 1000 (see FIG. 12) by a series of bolts through mounting holes. Cooling air for the lamp module 400 may enter a center air plenum 412 through an inlet connection 413 leading to an entrance hole 414. The cooling air may exit the lamp module through two outer air plenums 402 on either side of the center air plenum 412 and including exit holes 404 leading to exhaust connections 403. As is familiar to those skilled in the art, precise temperature monitoring and control during epitaxial deposition may be important for obtaining the proper deposition rate, film composition, and other film properties. Active feedback from the pyrometers to the lamp control electronics enables precise dynamic control of the wafer sleeve temperature throughout the epitaxial deposition process.

A cooling water inlet tube 420 leads to a network of channels within the lamp formed within the module structure 401 and then to a cooling water exit tube 421. The exact arrangement of the network of cooling channels may be freely chosen. Adequate water cooling of the lamp module 400 can be important in preserving lamp lifetimes, as well as ensuring that the illumination window (see FIG. 11) does not overheat, resulting in loss of IR transmission efficiency as well as vacuum integrity within the reactor chamber. As is familiar to those skilled in the art, the cooling system may be equipped with a pressure sensor to detect any loss in coolant pressure. Should such a drop in pressure occur, all power to the lamps would be cutoff immediately to protect the reactor module and operating personnel from any possible process gas leaks. The connection wires 418, 419 for the opposing ends of the lamps extend out the sides of the lamp module 400 as shown.

Figure 5:
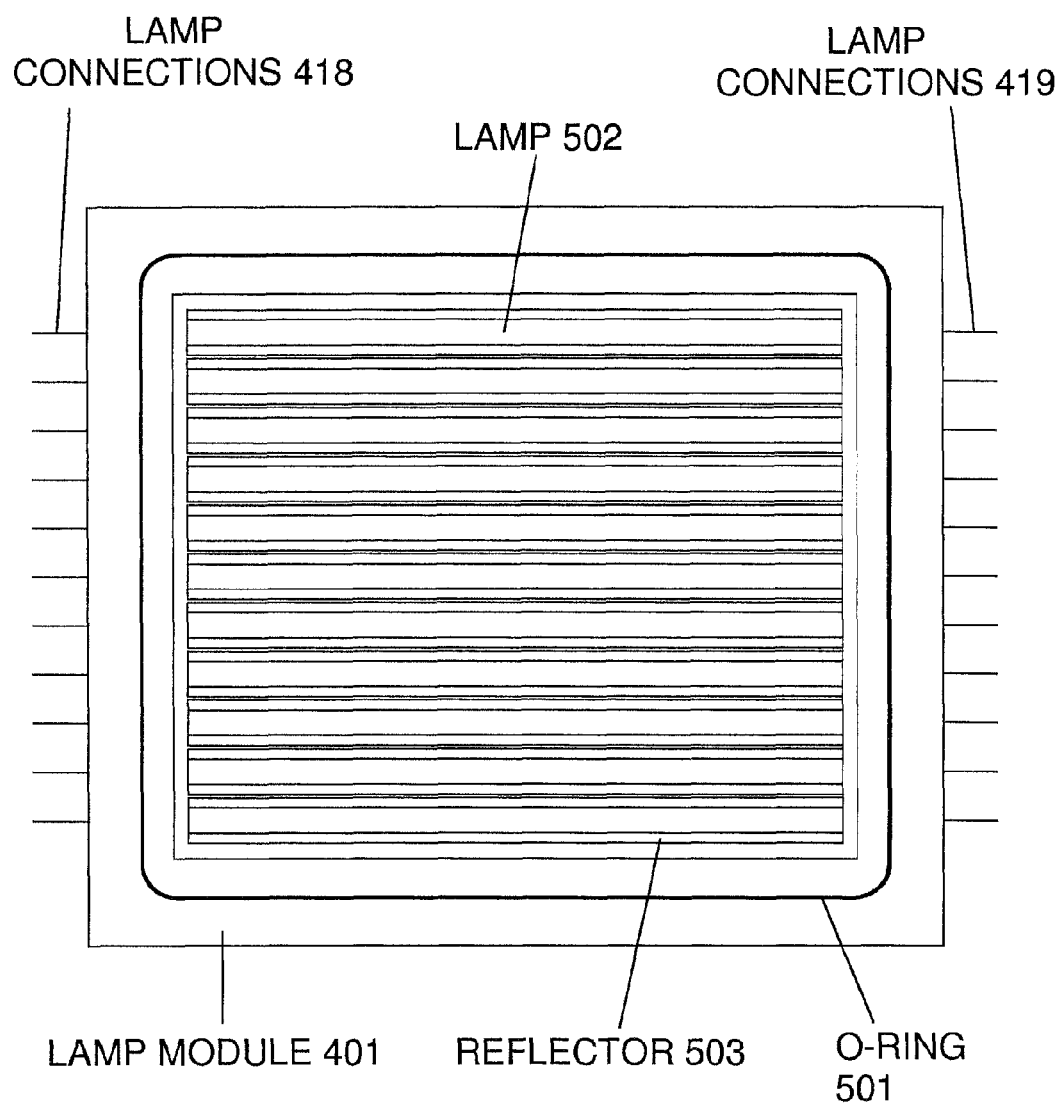
FIG. 5 is a schematic inner side view of the lamp module of FIG. 4.

A schematic inner side view of the lamp module 400 of FIG. 4 is shown in FIG. 5. Eleven lamps 502 are shown in FIG. 5; however, the exact number of the plural lamps 502 may be different. The lamps 502 extend linearly and horizontally in parallel and have electrode bases on opposed ends for their generally linearly extending coiled lamp filaments. A high-temperature O-ring 501 for sealing against the outer surface of the illumination window 1200 (see FIG. 13) is contained within a groove machined into the face of the lamp module structure 401. Each linearly extending lamp 502 is located within and to one side of a reflector 503, which is typically coated with gold to maximize IR reflectivity uniformity and minimize oxidation. The lamps 502 in conjunction with the reflectors 503 present a substantially planar source of radiant heat. The lamps 502 may typically be tungsten-halogen lamps with maximum emission in the infrared around 1.2 µm wavelength and operating with a filament temperature in excess of 2000° K. Each lamp 502 has a base (not shown) at each of the ends of its transparent glass lamp tube connected to opposed ends of the generally linearly extending filament and are removably connected to respective electrical sockets. These sockets are within the water-cooled lamp module housing, and are maintained at temperatures below about 300° C. in order to prevent damage to the high temperature O-rings which form an air-tight seal around the end of each lamp socket in order to maintain the pressure of the cooling air for the lamps 502 within the lamp module 400. The lamps should be designed to minimize radiation near their ends.

Figure 6:
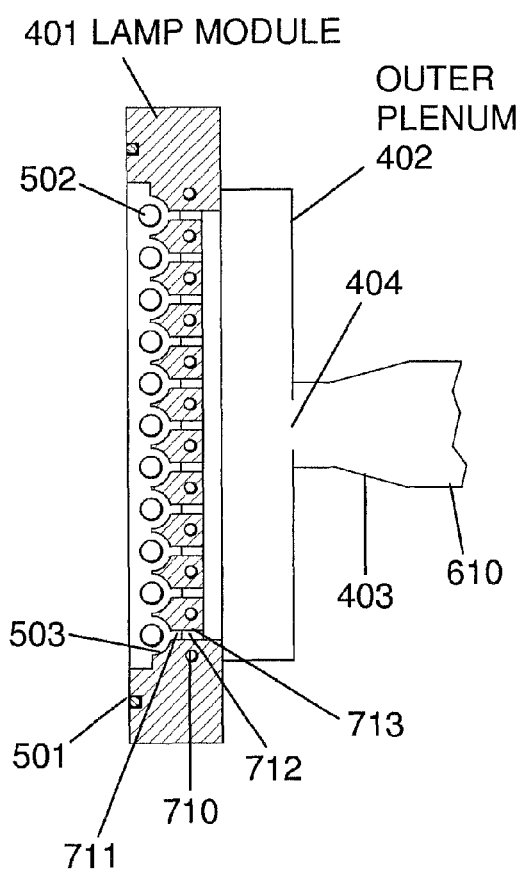
FIG. 6 is a schematic vertical cross-sectional view of the lamp module of FIG. 4 through an outer cooling air plenum.

A schematic vertical cross-sectional view A-A (see FIG. 4) through the lamp module of FIG. 4 at an outer cooling plenum is illustrated in FIG. 6. An outlet air duct 610 connects to the outlet cone 403 to conduct cooling air or other cooling gas for the lamps 502 out of the outlet cooling plenum 402 at the back of the lamps 502 and their reflectors 503. The outlet cooling plenum 402 connects to a multiplicity of air channels 712 defined by walls 713 running parallel to and behind each lamp 502. Plural air tubes 711 extending from each air channel 712 allow passage of cooling air from the air channels 712 through the reflectors 503 to each lamp 502. The cooling air from the inlet air plenum 412 is split and flows in opposite directions along the linearly extending lamps 502 to the two outlet cooling plenums 402 near the opposed ends of the lamps 502. Proper air cooling of the lamps 502 is important in maximizing lamp lifetimes, thereby reducing the amortized lamp costs per wafer processed while increasing system uptime and reducing maintenance requirements.

Figure 7:
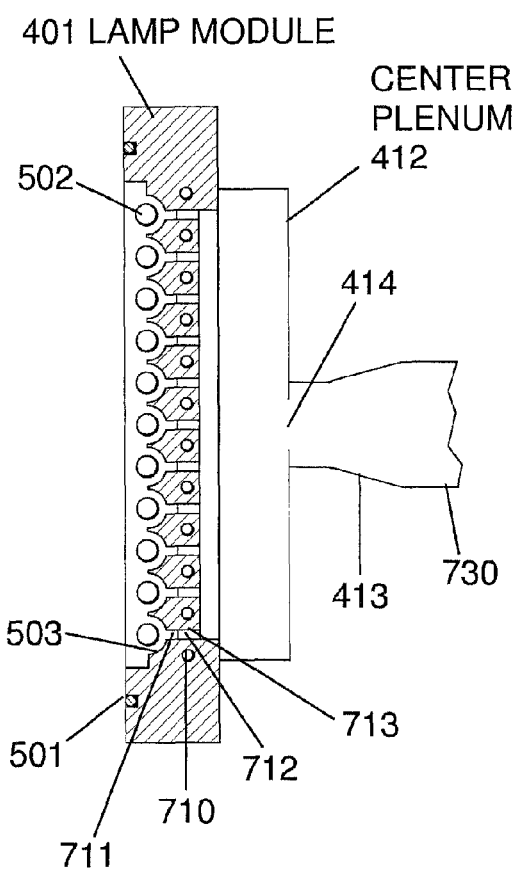
FIG. 7 is a schematic vertical cross-sectional view of the lamp module of FIG. 4 through the center cooling air plenum.

A schematic vertical cross-sectional view B-B through the midplane of the lamp module of FIG. 4 is illustrated in FIG. 7. An inlet air duct 730 connects to the inlet cone 413 to conduct cooling air for the lamps 502 into the inlet air plenum 412 at the back of the lamps 502 and their reflectors 503 near the axial middle of the lamps 502.

The inlet air plenum 412 connects to a multiplicity of air channels 712 running parallel to and behind each lamp 502. Plural air tubes 711 extending from each air channel 712 allow passage of cooling air from the air channels 712 through the reflectors 503 to each lamp 502.

Wafer Sleeve

Another disadvantage of prior art epitaxial deposition systems is high consumable costs arising from inefficient use of process gases. Thus, it would be desirable for an epitaxial reactor to improve the use of process gases in order to lower the volume of process gas needed to deposit a given film thickness. Yet another disadvantage of prior art epitaxial deposition systems is the large volume of the process chambers which must be filled by the process gases. This results in higher gas flow requirements and lower percentage utilization of the process gas. Often the inner surfaces of the process chambers are heated by the lamps or induction coils in order to heat the wafers, resulting in unwanted deposition on the chamber walls. Thus, it would be desirable to maintain the inner surfaces of the reaction chamber at a lower temperature than the wafers being heated to a reaction temperature and to minimize the volume of the reactor zone for which process gas must be supplied.

Still another disadvantage of prior art epitaxial deposition systems is unwanted deposition on various surfaces on the inside walls of the reactor chamber. This unwanted deposition may produce several undesirable consequences, including formation of particulates if this unwanted deposition fails to adhere to the reactor chamber walls and flakes off, and added unproductive consumption of process gases, thereby increasing variable costs for film growth, and requiring frequent opening up and cleaning of the reactor chamber. Thus, it would be desirable for an epitaxial reactor to have minimal unwanted deposition on the walls of the reactor chamber, instead restricting most deposition to the wafer and possibly a small surrounding area of a wafer carrier.

Accordingly, another aspect of the invention includes a wafer sleeve which mounts multiple wafers within an interior of the wafer sleeve, defines the flow of process gases within the wafer sleeve away from the walls of the reactor, and which may be radiantly heated apart from the walls of the reactor. That is, the reactor walls may be at a substantially lower temperature than the wafers being processed and are generally not exposed to the deposition gases. In one embodiment, the sleeve includes two carrier plates having two respective generally planar and parallel principal surfaces on which the wafers are mounted to face a reaction zone within the sleeve. The lateral sides of the sleeve are closed and, in one embodiment, the gas delivery system at last partially seals one or both of the ends of the sleeve to restrict the flow of processing gas to the reaction zone inside the sleeve while the spent processing gas flows out the other end. However, the transportable sleeve itself is preferred to have two open ends.

Figure 8:
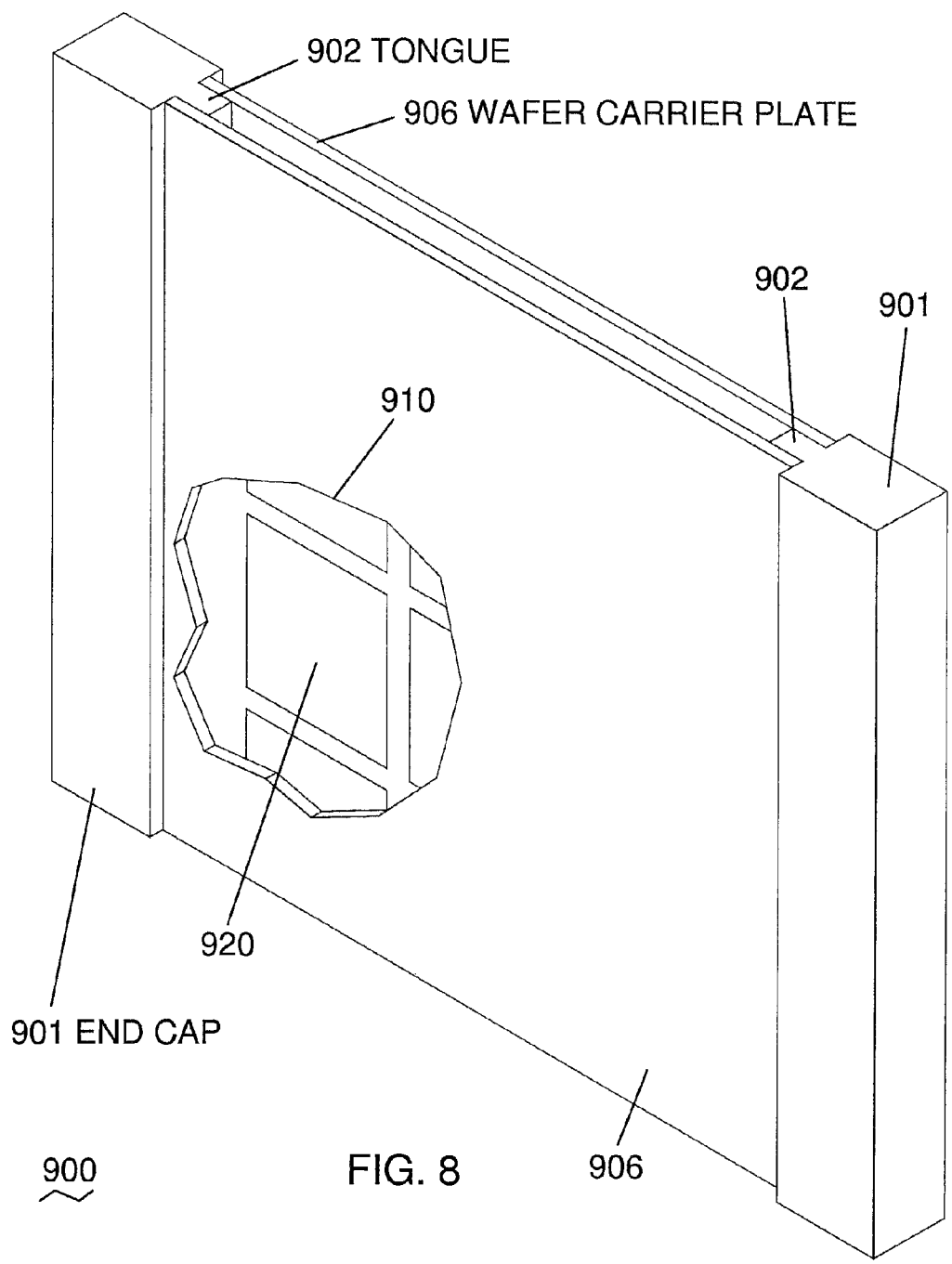
FIG. 8 is a schematic isometric view shown in partial cutaway of a wafer sleeve of the present invention.

A schematic isometric view in partial cutaway of a wafer sleeve 900 of one embodiment of the present invention is shown in FIG. 8. Two carrier plates 906 are detachably attached to two end caps 901, for example, by threaded screws or bolts, clamps, springs, or spring-loaded clamps. Tongues 902 extending from each end cap 901 determine the spacing between the inner surfaces of the wafer carrier plates 906, which together with the end caps 901 define a processing cavity generally open on two opposed ends. A multiplicity of wafers 920, some being visible through a partial cutaway 910, are mounted with good thermal contact on their back sides to the wafer carrier plates 906 by some detachable attachment means such as, for example, shoulder screws 930 (see FIG. 9) screwed into the wafer carrier plates 906 and capturing the wafers 920 with their shoulders. The end caps 901 may be incorporated into more complexly shaped carrier plates 906.

The invention allows efficient epitaxial deposition of silicon layers on substrates having at least a surface layer of crystalline silicon. Such a substrate may be a monocrystalline silicon wafer, as used in the integrated circuit industry, or have a crystalline layer of silicon attached to a non-silicon substrate. In some applications, the silicon layer is deposited on a porous silicon layer of a mother wafer and the deposited silicon film is then delaminated from the mother wafer and attached to a foreign substrate for further processing and mounting.

Figure 9:
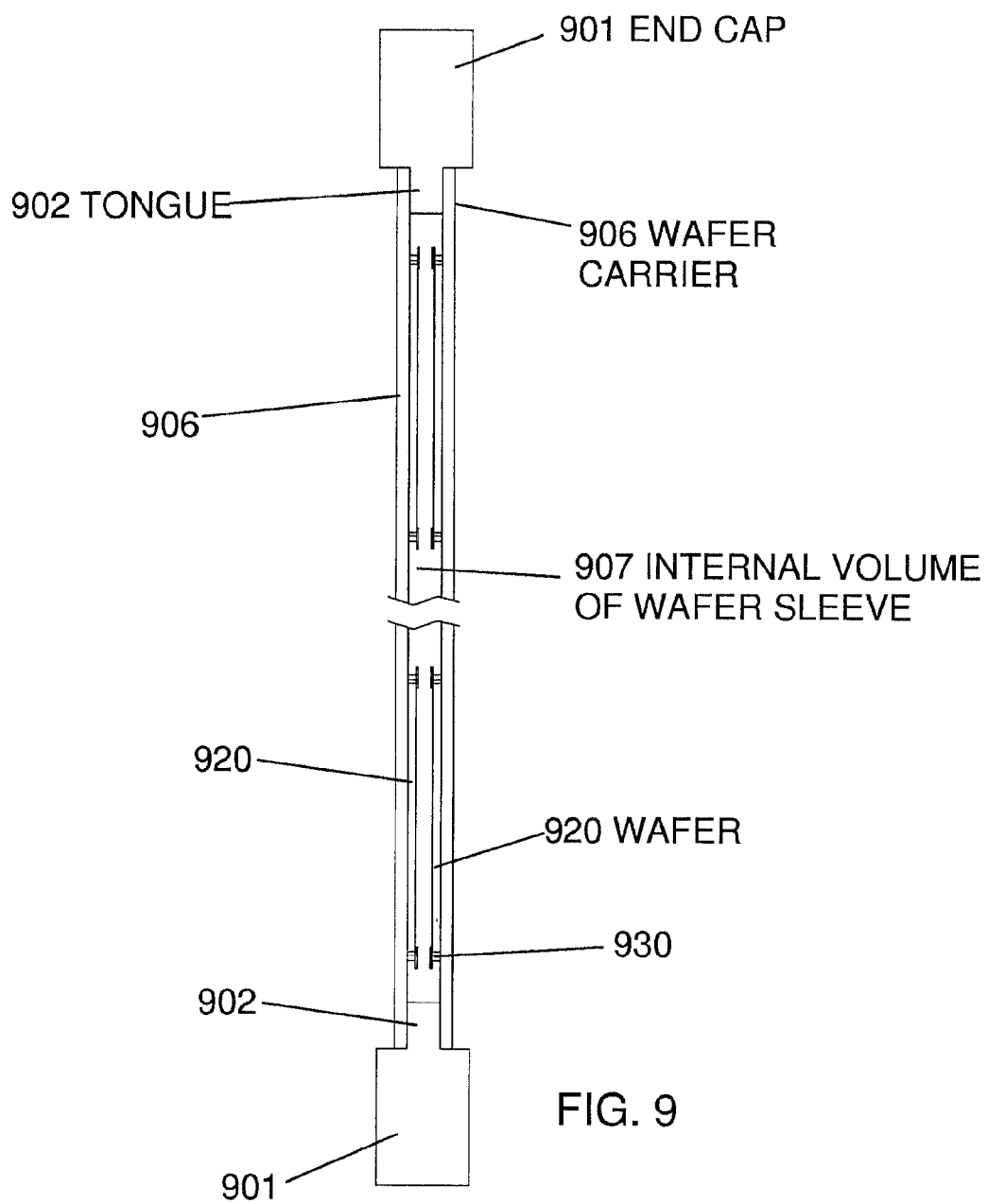
FIG. 9 is a schematic top view of the wafer sleeve of FIG. 8.

For insertion and removal of wafers 920 into and out of the wafer sleeve 900, the wafer sleeve 900 can be disassembled, allowing easy access to the inner surfaces of the wafer carrier plates 906. As illustrated in FIG. 9, a number of wafers can be attached in good thermal contact with the inner surfaces of the wafer carrier plates 906. After all the wafers 920 are attached, the wafer sleeve is then reassembled as shown in FIGS. 8 and 9, placing the wafers to be processed in the interior of the wafer sleeve 900.

The wafers 920 may be rectangular in view of their possible eventual use as part of panel of closely packed solar cells. The spacing between the top process surfaces of the wafers 920 is generally equal to the spacing between the inner surfaces of the wafer carrier plates 906 minus the thicknesses of the two wafers 920. By making the spacing between the inner surfaces of the carrier plates 906 in the range from 2 to 8 mm, more generally 2 mm to 2 cm, the present invention enables the creation of a very small reaction volume 907. To accommodate multiple wafers in a two-dimensional array, the principal walls of the sleeve 900, that is, the carrier plates 906, preferably have lateral dimensions of 40 cm or more so that the aspect ratio of the lateral dimensions to thickness of the interior of the sleeve 900 is at least 20:1 and preferably greater than 40:1. As the process gases flow within this small reaction volume between the wafer carrier plates 906, the boundary layers above each wafer may comprise a substantial fraction of the total reaction volume. Because gas velocities decrease within boundary layers, the reaction time of the process gases with the heated wafers 920 is thereby increased, leading to improved reaction efficiencies. End caps 901 with various tongue 902 widths may be used to select different spacings between the inner surfaces of the wafer carrier plates 906 to optimize the reactor module for various epitaxial deposition processes and gas mixtures. FIG. 9 is a schematic top view of the wafer sleeve of FIG. 8, showing shoulder screws 930 clamping the wafers 920 in good thermal contact with the wafer carrier plates 906.

Reactor Frame, Reactor Chamber, and Cross Flow Processing

A disadvantage of prior art epitaxial deposition systems is the need for rotary motions of the wafer susceptor or wafer carrier within the reactor chamber in order to achieve the desired uniformities of film thickness and resistivity. As is well known in the art, mechanical motions may create a number of design and operational difficulties within chambers containing hot reactive gases. Thus, it would be desirable for an epitaxial reactor to achieve desired process film uniformities without the need for rotary or other types of motions of the wafers during processing.

Accordingly, another aspect of the invention includes a reaction chamber allowing alternately flowing process gases in opposite or anti-parallel directions across the wafers, preferably stationary wafers.

Figure 10:
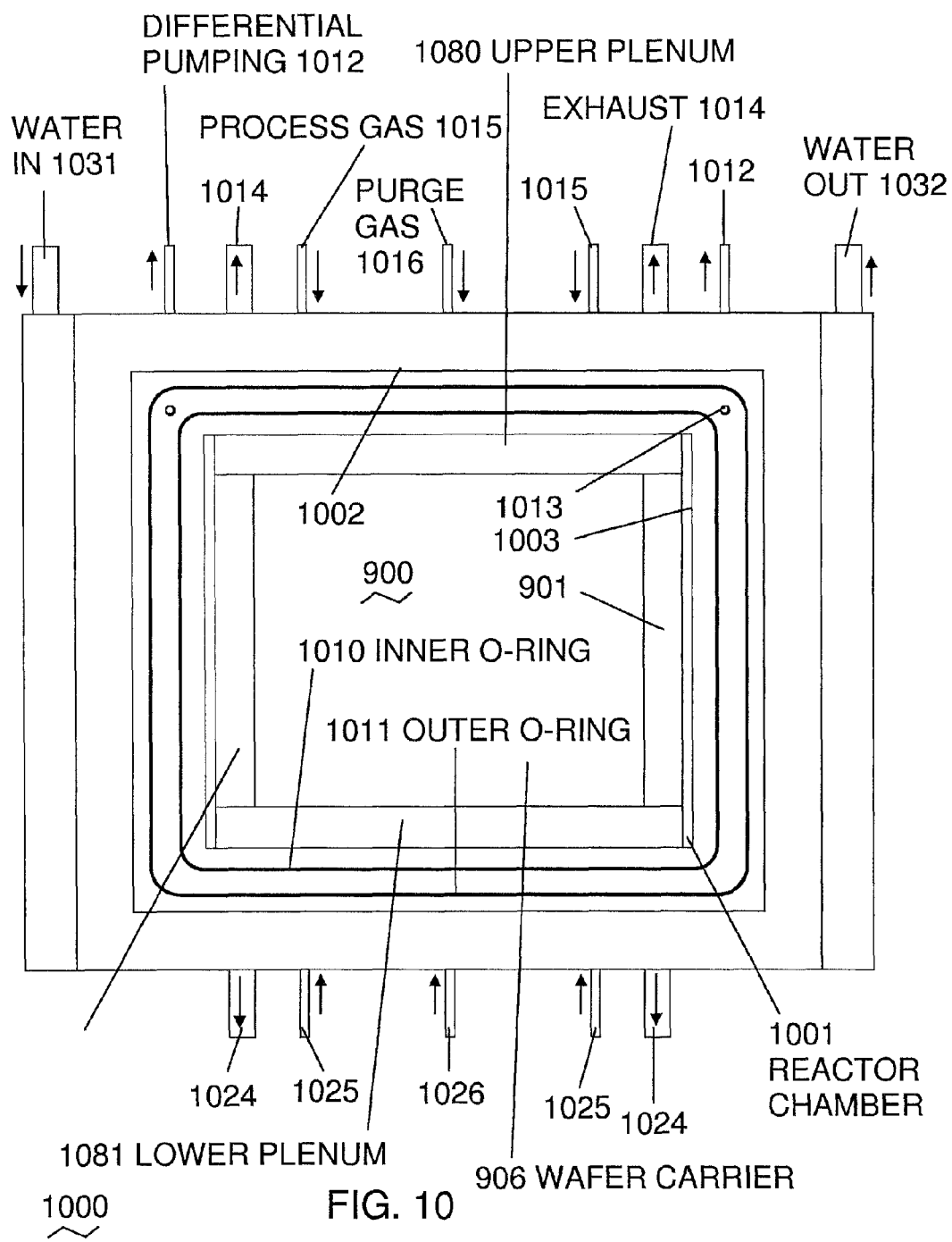
FIG. 10 is a schematic side view of a reactor frame of the present invention.

A schematic side view of a reactor frame 1000 of the present invention is shown in FIG. 10. The wafer sleeve 900 containing the wafers (not shown) on which an epitaxial film is to be deposited is contained within a reactor chamber 1001. The reactor chamber 1001 includes a central opening formed by four interior walls 1003 in the reactor frame 1000 and by two illumination windows 1200 (see FIG. 11) fitting within recesses 1002 on opposed sides of the reactor frame 1000. Cooling water for the reactor frame 1000, which is preferably formed of a metal, enters through an inlet line 1031, then flows through a network of cooling channels (not shown) within the reactor frame 1000, and finally exits through an outlet tube 1032. Adequate cooling of the reactor frame 1000 serves to maintain the walls of the reactor chamber 1001 at low enough temperatures to minimize undesirable epitaxial deposition on the frame 1000. An outer high temperature O-ring 1011 and an inner high temperature O-ring 1010 seal against the inner surface of the illumination window 1200 to form a differentially-pumped seal between the interior of the reactor chamber 1001 and the air. Differential pumping connections 1012 lead to openings 1013 between the two O-rings 1010, 1011.

Two exhaust lines 1014 extend out the top of the reactor frame 1000, and two more exhaust lines 1024 extend out the bottom of the reactor frame 1000. One purge gas inlet line 1016 connects with the top of the reactor frame 1000, and another purge gas inlet line 1026 connects with the bottom of the reactor frame 1000. Two process gas inlet lines 1015 connect with the top of the reactor frame 1000 and two more process gas inlet lines 1025 connect with the bottom of the reactor frame 1080. A horizontally extending upper process plenum 1080 is mounted to the interior wall 1003 at the top of the reactor chamber 1001. The process gas lines 1015 and exhaust lines 1014 at the top of the reactor frame 1000 are connected to the interior of the upper process plenum 1080 and the purge gas line 1016 is directed to the exterior of the upper process plenum 1080 as described below in FIG. 13. Similarly, a lower plenum 1081 is mounted to the interior wall 1003 at the bottom of the reactor chamber 1001. The process gas lines 1025 and exhaust lines 1024 at the bottom of the reactor frame 1000 are connected to the interior of the lower process plenum 1081 and the purge gas line 1026 are directed to the exterior as described below in FIG. 13. The upper process plenum 1080 is positioned within the reactor chamber 1001 to have a small and perhaps minimal clearance between the lower surface of the upper process plenum 1080 and the upper surface of the wafer sleeve 900 to provide a somewhat leaky seal between them, thereby minimizing process gas leakage from within the sleeve 900 against a pressure differential (see FIG. 13) of the process gas being held at a lower pressure than the purge gas. However, in one embodiment, the leaky seal provides an exhaust pumping path for otherwise generally stagnant purge gas outside the wafer sleeve 900. Similarly, a lower plenum 1081 is positioned within the reactor chamber 1001 to have a minimal clearance between the upper surface of the lower plenum 1081 and the lower surface of the wafer sleeve 900, thereby minimizing gas leakage while perhaps providing an exhaust path for the purge gas under a pressure differential (see FIG. 13).

Valves and gas supplies or exhaust ports are connected to the inlet and outlet ports so that the gas flows can be reversed although it is possible to not reverse the in flow of the purge gas.

Further, the process gas may be switched during processing to providing different doping types for n-type, intrinsic, and p-type silicon or other semiconductor, for example, adding borane or phosphine to trichlorosilane, or to provide other process gases such as hydrogen to affect the morphology of the deposited material.

The functioning of the purge and process gas inlets and the exhaust gas outlets during a cross-flow epitaxial deposition process is as follows. As described with reference to FIG. 15, the epitaxial reactor 1804 may be operated using a bi-directional process gas flow procedure, called "cross-flow" processing. In a first phase of cross-flow processing, the process gases used for the CVD precursors flow downwards from the top process gas inlets 1015 of FIG. 10 at the top of the reactor frame 1000 first into the upper process plenum 1080 and then into the wafer sleeve 900. The process gases from the inlets 1015 are directed by the upper process plenum 1080 preferentially into the interior of the wafer sleeve 900 between its wafer carrier plates 906 to maximize utilization of the process gas. At the same time, purge gas, typically hydrogen, flows downwards into the reactor chamber 1001 from the top purge gas inlet line 1016 to the exterior of the wafer sleeve 900. The purge gas is directed preferentially outside the wafer carrier plates 906 of the wafer sleeve 900 to reduce or eliminate deposition on the window and walls of the reactor chamber 1001. The pressure of the purge gas outside of the wafer sleeve may be adjusted to exceed the pressure of the reactant gases within the wafer sleeve 900, thereby ensuring minimal leakage of reactant gases out of the interior volume of the wafer sleeve 900 and allowing the purge gas to be exhausted through the leaky seals into the interior of the plenums, particularly the outlet plenum being pumped. In this first phase, product gases and unused reactant gases from the interior of the wafer sleeve 900 flow into the lower process plenum 1081 and the purge gas flows from the portion of the reaction chamber 1001 exterior to the wafer sleeve 900 through the leaky seal into the lower process plenum 1081. The product gas, unused process gas, and purge gas then flow into the open pumped exhaust lines 1024 on the bottom of the reactor frame 1000. The bottom purge gas 1026, process gas lines 1025, and top exhaust lines 1014 are valved off during the first phase of epitaxial deposition.

In a second phase of cross-flow processing, the process gases flow upwards from the bottom process gas inlets 1025 first into the lower process plenum 1081 and then into the wafer sleeve 900. As for the first phase of cross-flow processing described above, the process gases from the bottom process gas inlets 1025 are directed preferentially into the interior of the wafer sleeve 900 by the lower process plenum 1081 to maximize the efficiency of process gas usage. At the same time, purge gas, typically hydrogen, flows from the bottom purge gas inlet line 1026 upwards into the reactor chamber 1001 exterior to the wafer sleeve 900. The purge gas is directed preferentially outside the wafer sleeve 900 to reduce or eliminate deposition on the window and walls of the reactor chamber 1001, as in the first phase described above. In this second phase, product gases and unused reactant gases flow from the interior of the wafer sleeve 900 into the upper process plenum 1080 and purge gas from the portion of the reactor chamber 1001 exterior to the wafer sleeve 900 flow through the leaky seal into upper process plenum 1088. The product and unused processes gases and the purge gas then flows into the exhaust lines 1014 on the top of the reactor frame 1000. The top purge gas lines 1016, process gas line 1015, bottom exhaust lines 1024 are valved off during the second phase of epitaxial deposition.

Figure 11:
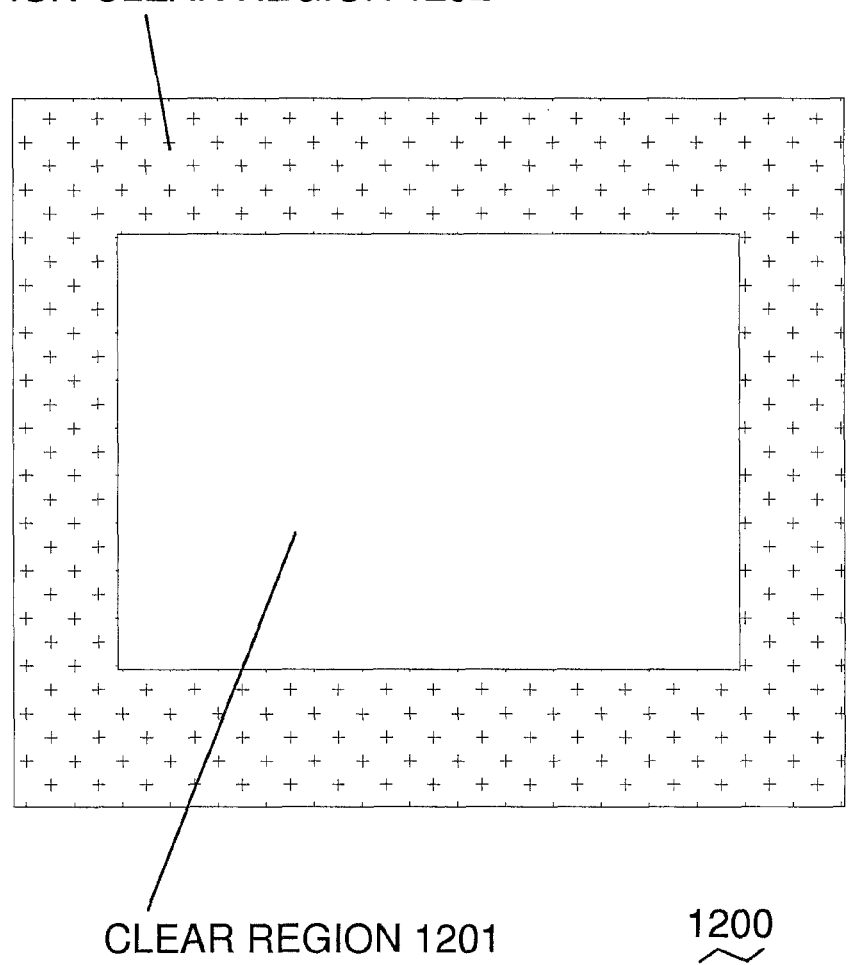
FIG. 11 is a schematic view of an illumination window of the present invention.

A schematic view of the illumination window 1200 of the present invention is illustrated in FIG. 11. Typically, the illumination window 1200 can be quartz, approximately 10 mm thick with a non-clear region 1202 surrounding a central clear region 1201. The central clear region 1201 may be sized to approximately match the dimensions of the lamp-heated sides of the wafer sleeve 900. The outer non-clear region 1202 may be sized to cover the high temperature O-rings 1010, 1011 within the reactor frame 1000 (see FIG. 12), thereby protecting the O-rings 1010, 1011 against heating from the lamp module 400. There are several alternatives for the construction of the non-clear region 1202. It may be covered with a reflective substance to reflect any illumination from the lamp module 400 which strikes the non-clear region 1202. Alternatively, the non-clear region 1202 may be made from translucent quartz which will reflect some illumination and scatter some illumination from the lamp module 400.

Figure 12:
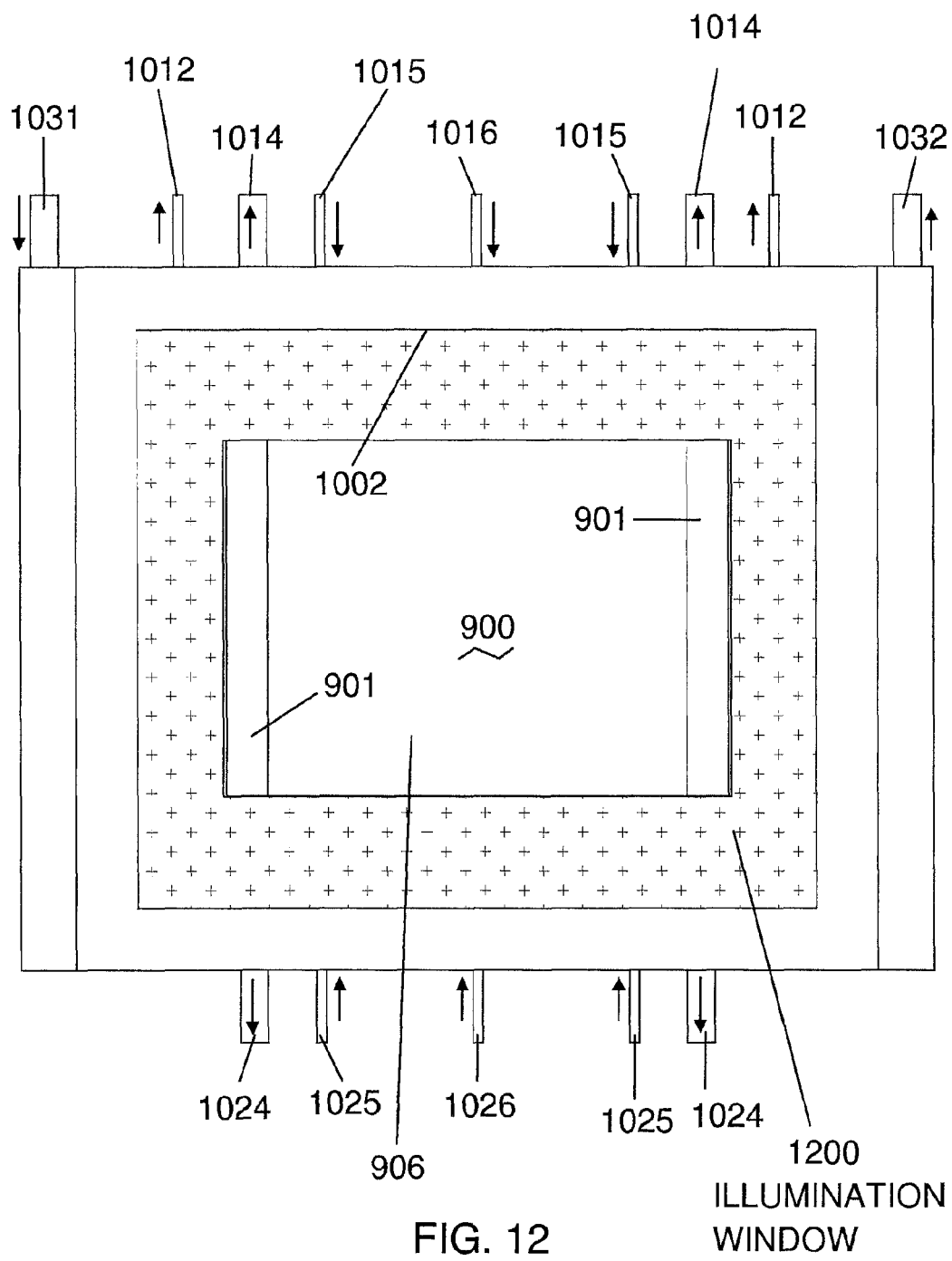
FIG. 12 is a schematic side view of the reactor frame of FIG. 10 with the illumination window of FIG. 11 in place.

The schematic side view of FIG. 12 shows the reactor frame 1000 of FIG. 10 with an illumination window 1200 installed into the recess 1002 in the reactor frame 1000. The purpose for the non-clear region 1202 of illumination window 1200 can be seen from FIG. 12 where the non-clear region 1202 shields the high-temperature O-rings 1010, 1011 from the light emitted from the lamps 502 in the lamp module 400.

Gas Distribution Plenums in the Reactor Frame

Figure 13:
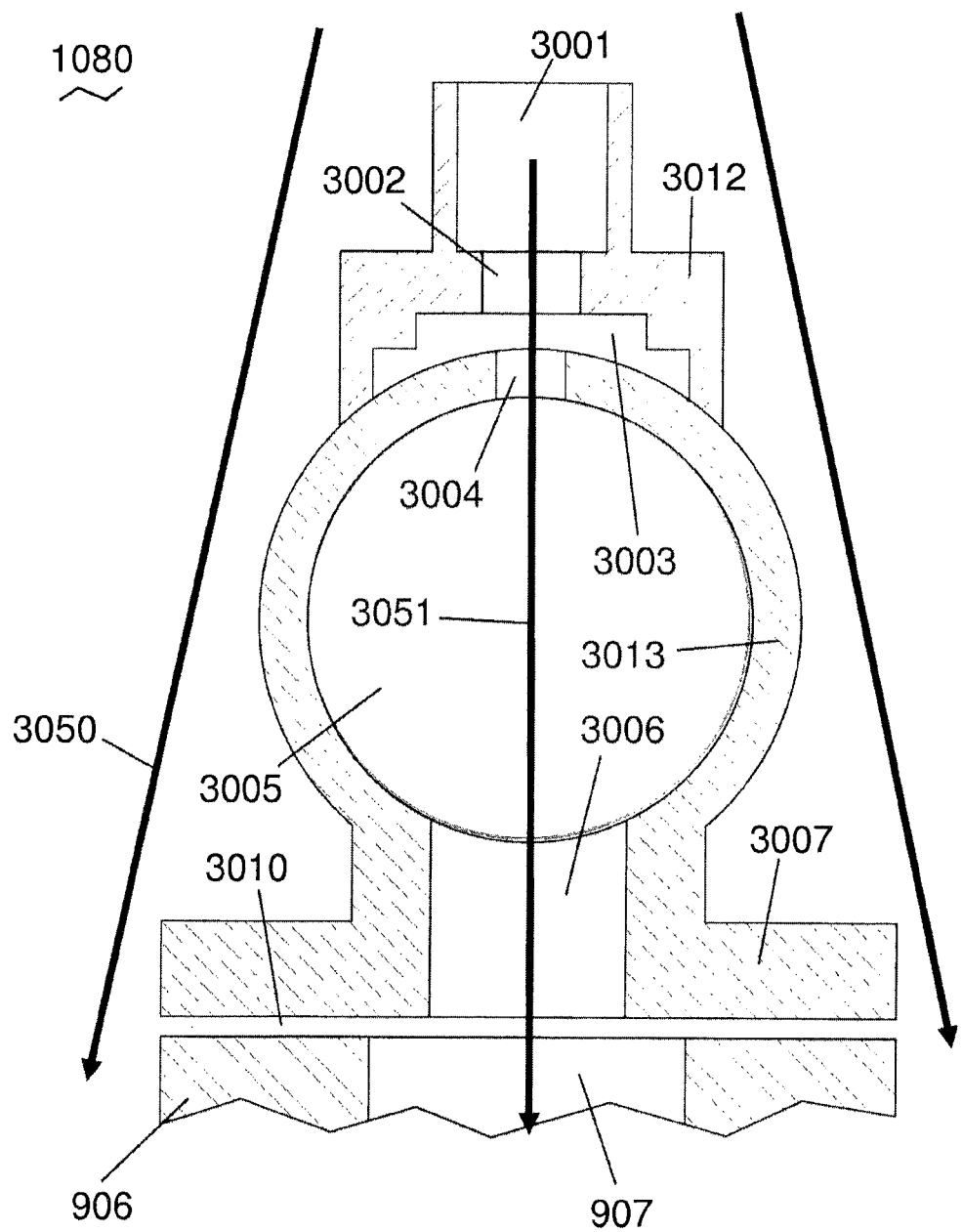
FIG. 13 is a schematic cross-section of a gas plenum.

As described above for FIG. 10, two process plenums 1080, 1081 are mounted within the reactor chamber 1001 to facilitate even distribution of process gases into the interior of the wafer sleeve 900 and to remove gases from the reactor chamber 1001. FIG. 13 is a schematic cross-section of the upper plenum 1080 as well as the top of a wafer sleeve 900. The lower process plenum 1081 may be similar or identical, but would be typically mounted in an inverted configuration compared with the upper process plenum 1080 as shown in FIG. 13. The following discussion relates to the upper process plenum 1080 but is equally applicable to the lower process plenum 1081. The process gas lines 1015 (not shown here) are connected through connection tubes 3001 and openings 3002 to an upper distribution plenum 3003 formed by plenum structure 3012. A first multiplicity of holes 3004 are distributed along the length of the upper distribution plenum structure 3012, extending across the upper width of the wafer sleeve 900 as shown in FIG. 10, and enabling even filling of the interior 3005 of tube 3013 with process gases. A second multiplicity of holes 3006, also extending across the upper width of the wafer sleeve 900, extend out from the bottom of the tube 3013, enabling process gases 3051 to flow into the interior 907 of the wafer sleeve 900.

Purge gases 3050 flowing into the reactor chamber 1001 from feed line 1016 flow around the upper plenum 1080 as shown. The upper plenum 1080 may have a flange structure 3007 to reduce leakage into the interior of the wafer sleeve 900 through the gap 3010 formed between the flange 3007 and the upper edges of the wafer carrier plates 906. Operation of the lower plenum 1081 may be essentially the same as described above, except using the corresponding process gas 1025, purge gas 1026 and exhaust lines 1024 at the bottom of the reactor frame 1000.

One or more wide exhaust ports are connected to the interior 3005 of the tube 3001 and pump the reaction volume within the wafer sleeve 900 through the series of wide holes 3006. This dual use of the process plenum requires that the process supply and exhaust be alternately performed upon each of the opposed process plenums.

Although it is possible to adapt the reactor chamber 1001 to operate at low pressures, good epitaxial deposition is accomplished by near atmospheric operation, but with pressure differentials sufficient to control the gas flows.

With the cross-flow process during downwards gas flow, when the upper process plenum 1080 supplies process gases into the interior 907 of the wafer sleeve 900, the lower process plenum 1081 provides an exhaust for removing gases from the interior 907 of the wafer sleeve 900 and the rest of the reactor chamber 1001. During upwards gas flow, the lower plenum 1081 supplies process gases into the interior 907 of the wafer sleeve 900 and the upper plenum provides an exhaust for removing gases from the interior 907 of the wafer sleeve 900.

Epitaxial Reactor with Two Lamp Modules

Figure 14:
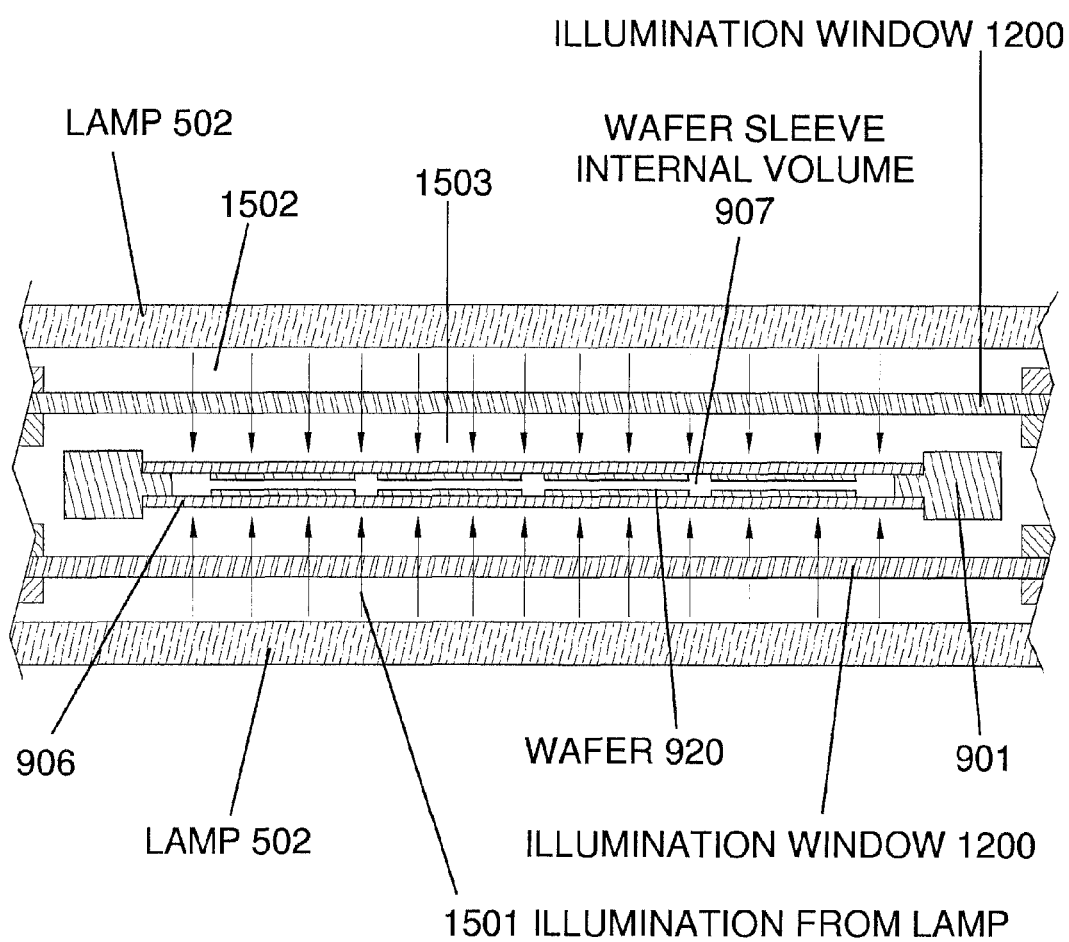
FIG. 14 is a schematic top partial cross-sectional view of the reaction area of the epitaxial reactor of FIG. 4.

FIG. 14 is a schematic partial close-up top cross-sectional view C-C of the reaction area of the epitaxial reactor of FIG. 10. As described above in FIG. 10, process gases are preferentially directed into the interior volume 907 of the wafer sleeve 900, which is enclosed by the carrier plates 906 and the end caps 901. Purge gases are preferentially directed into the interior volume 1503 within the reactor chamber 1001 surrounding the wafer sleeve 900. As described for FIG. 13, the pressure of the purge gases outside of the wafer sleeve may be adjusted to exceed the pressure of the process gases within the wafer sleeve 900, thereby ensuring minimal leakage of process gases out of the interior volume 907 of the wafer sleeve 900. The volume 1503 may be sealed by slit valves (see, for example, the slit valves 1803 and 1805 in FIG. 15), thereby forming a closed volume surrounding the wafer sleeve 900. Alternatively, volume 1503 may essentially extend into neighboring epitaxial reactor chambers as shown, for example, in FIG. 20 where the epitaxial reactors 2304, 2306 and 2308 are separated by pass-through chambers 2305 and 2307.

The illumination windows 1200 on both sides of the wafer sleeve 900 form barriers between the reactor chamber 1001 and the air 1502 or other cooling gas surrounding the lamps 502, allowing the illumination 1501 from the lamps 502 to pass into the reaction chamber 1001.

Three Module Epitaxial Reactor with Cross-Flow Processing

Figure 15:
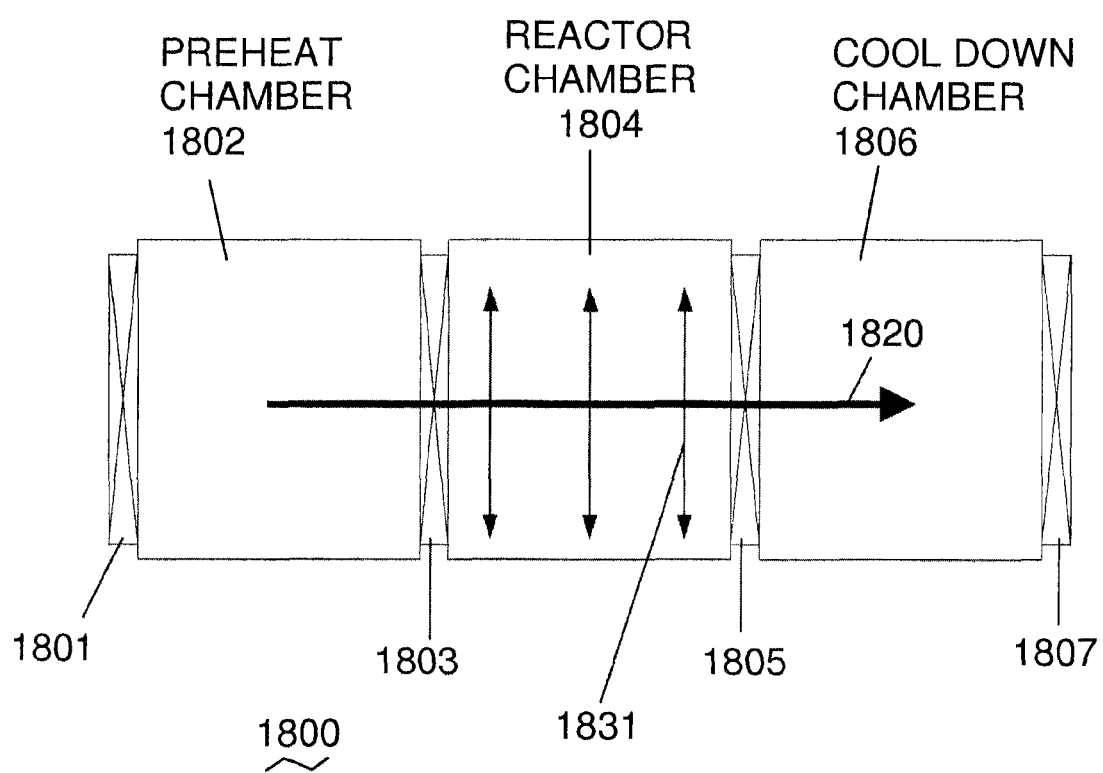
FIG. 15 is a schematic view of a three module epitaxial reactor of the present invention with cross-flow processing.

A three module epitaxial reactor 1800 of one embodiment of the present invention is illustrated schematically in FIG. 15. A wafer sleeve (not shown) loaded with wafers ready for processing can be loaded in the direction 1820 through a reactor entrance slit valve 1801 into a preheat chamber 1802. The preheat chamber can use any number of methods of heating the wafer sleeve such as lamps, resistive elements, or induction heating. The profile of temperature with time for the wafer sleeve within the preheat chamber 1802 should be fast enough to keep up with the deposition times of films in the subsequent epitaxial reactor chamber(s), but slow enough to avoid thermally-induced stresses in the wafers within the wafer sleeve. The preheat chamber 1802 may have a structure simplified from that of the reactor chamber but having two lamp modules to radiantly heat the wafer sleeve. However, simpler heating apparatus are possible, such as resistively or inductively heated chambers.

After the wafer sleeve has reached the proper temperature, a preheat chamber slit valve 1803 is opened to permit transfer of the wafer sleeve from the preheat chamber 1802 into the epitaxial reactor 1804. The preheat chamber slit valve 1803 would then be closed. A reactor slit valve 1805 must also have been closed by this time. Now, an epitaxial deposition process is initiated within the reactor 1804 upon the stationary wafer sleeve 900 until the desired film thickness has been deposited on the wafers within the wafer sleeve 900 located in the reactor 1804. Bi-directional arrows 1831 illustrate the two directions of process gas flow for a cross-flow epitaxial process within the reactor 1804. As discussed below, due to reactant gas depletion effects, a cross-flow epitaxial deposition process may be required within reactor 1804 in order to achieve the required film thickness and resistivity uniformities within and between the wafers contained in the wafer sleeve.

Next, the reactor slit valve 1805 is opened to permit transfer of the hot wafer sleeve into a cool down chamber 1806, after which the reactor slit valve 1805 would be closed. The cool down chamber 1806 may have a structure greatly simplified from that of the reactor 1804, for example, having two water-cooled frames facing the wafer sleeve 900. An exit slit valve 1807 would also already have been closed at this time to avoid premature exposure of the wafer sleeve to the air before adequate cooling down has occurred. The wafer sleeve then remains in the cool down chamber 1806 until a low enough temperature for removal has been achieved, after which the exit slit valve 1807 is opened and the wafer sleeve is removed from the epitaxial reactor system. For optimum throughput, more than one wafer sleeve may be in transit through the epitaxial reactor system at any one time. For example, a first wafer sleeve might be cooling off in the cool down chamber 1806, while a second wafer sleeve is undergoing epitaxial deposition in the reactor 1804, and a third wafer sleeve is heating up in the preheat chamber 1802. Note that for this first embodiment, the average processing time for the wafers in the wafer sleeve is equal to the time to deposit the entire required film thickness in the single reactor chamber 1804.

The processing within the reactor 1804 may vary over a process cycle in order to provide a graded structure, for example, of semiconductor dopants.

The wafer sleeves may be transported into and through the series of chambers and reactors by a transport mechanism capable of high-temperature operation and of placing the sleeves at predetermined positions with the chambers or reactors. For example, silicon carbide bearings may be used for movable support and vertical alignment of the wafer sleeves even near and into the hot zone. The drive mechanism may be stored in cooler regions of the chambers or reactors during high-temperature processing, for example, away from the lamps, for example, adjacent the slit valves. When sleeve movement is required, the drive mechanism can engage cooler portions of the sleeve or can wait for partial cooling of the chambers or reactors before extending, movement arms or other mechanisms to engage the sleeve to move it to its next position.

Figure 16A:
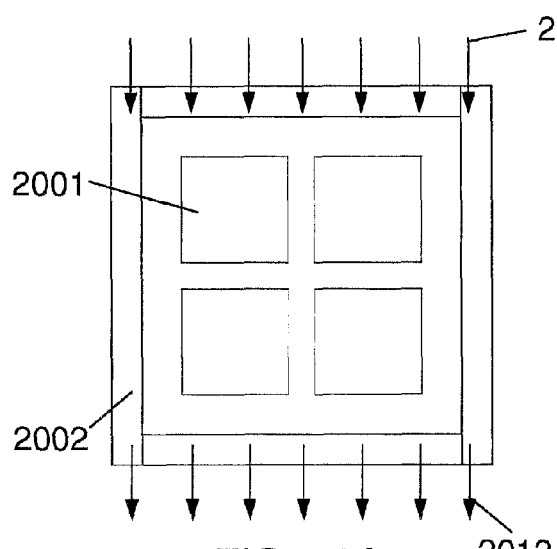
FIGS. 16A-D are schematic views of the process gas and exhaust flows for an embodiment of the present invention with four different flow orientations.
Figure 16B:
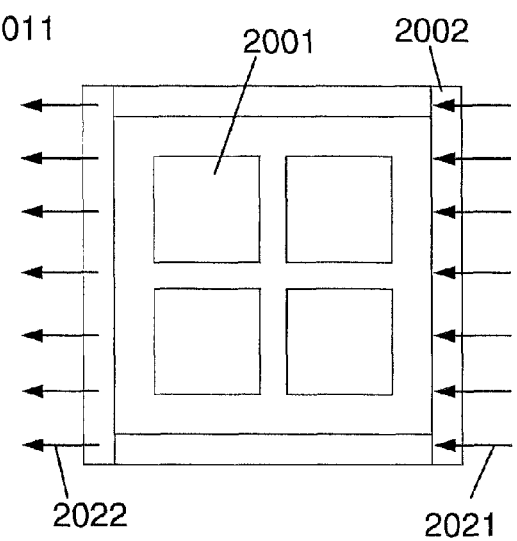
Figure 16C:
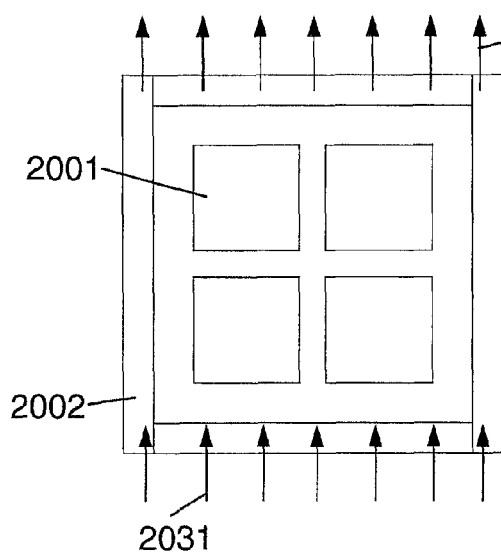
Figure 16D:
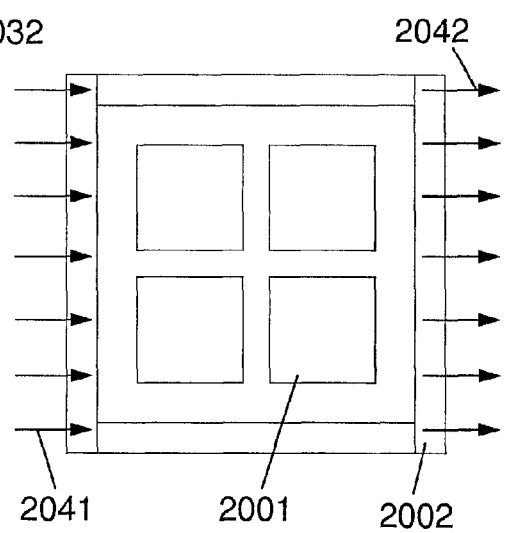

Epitaxial Reactor with Cross-Flow Processing Along Four Approximately Orthogonal Directions In the embodiment shown in FIG. 15, the process gases alternate between downwards and upwards flow. However, in some cases, a degree of left-right asymmetry may remain in the film thickness and resistivity uniformities achieved in such a bi-directional deposition process. FIGS. 16A-D schematically illustrate a four-step process which could reduce or eliminate this undesirable deposition uniformity. FIGS. 16A-D illustrate the same four wafers 2001 mounted in good thermal contact with a wafer sleeve 2002 within a reaction chamber (not shown). FIG. 16A and FIG. 16C correspond to the first and second steps described in FIG. 15, respectively.

For FIG. 16A, the reactant and purge gases 2011 are admitted to the reaction chamber at the top, while the process gas exhaust 2012 emerge from the bottom of the reaction chamber. For FIG. 16C, the reactant and purge gases 2031 are admitted to the reaction chamber at the bottom, while the process gas exhaust 2032 would emerge from the top of the reaction chamber. The key difference between FIG. 15 and FIGS. 16A-D is the addition of two additional deposition steps in FIGS. 16B and 16D for which the process gas and exhaust gas directions are approximately orthogonal to the directions in FIGS. 16A and 16C. For FIG. 16B, the reactant and purge gases 2021 would be admitted to the reaction chamber from the right, while the process gas exhaust 2022 would emerge from the left of the reaction chamber. For FIG. 16D, the reactant and purge gases 2041 would be admitted to the reaction chamber from the left, while the process gas exhaust 2042 would emerge from the right of the reaction chamber.

Figure 2:
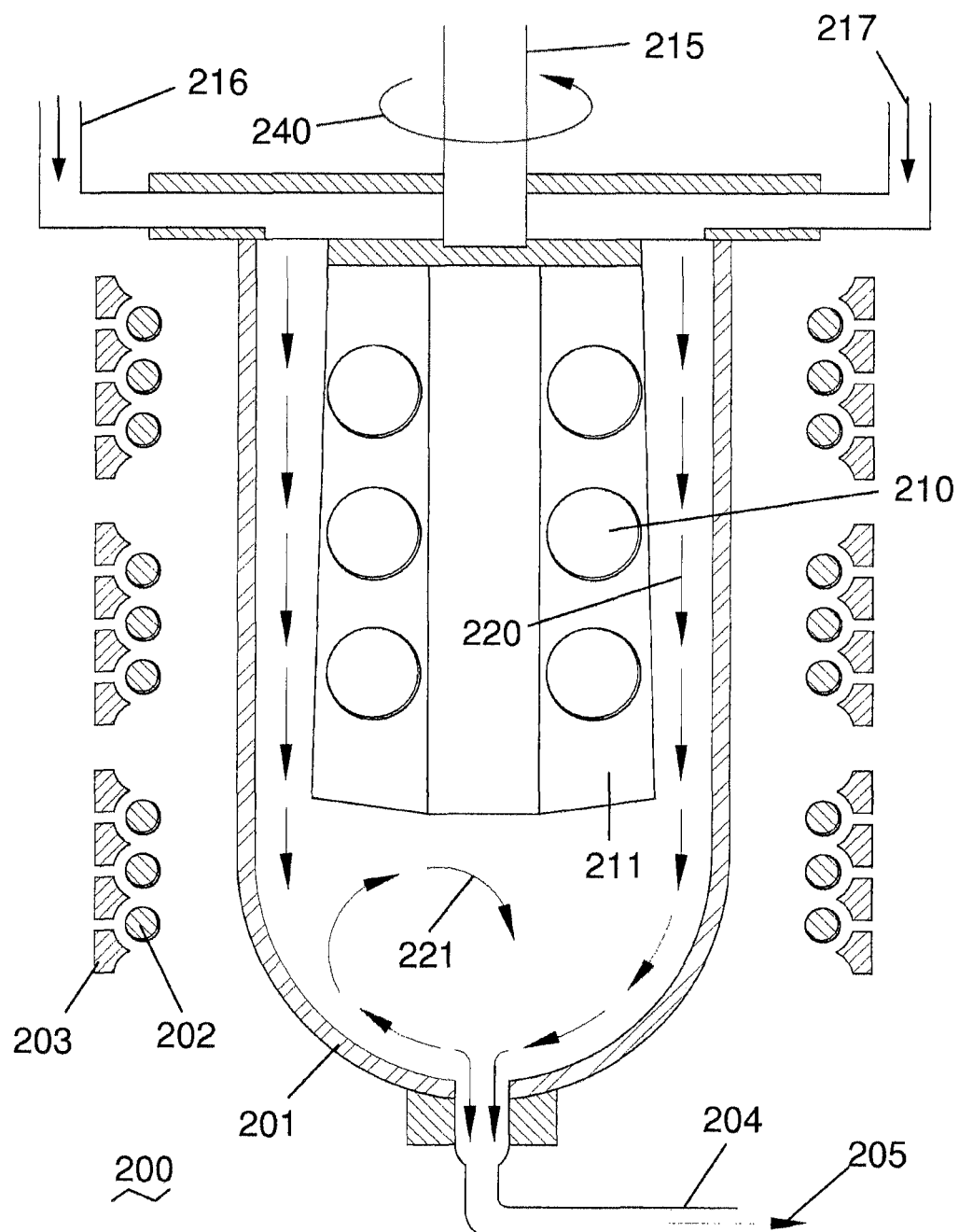
FIG. 2 is a schematic side cross-sectional view of a prior art barrel type epitaxial reactor.
Figure 3:
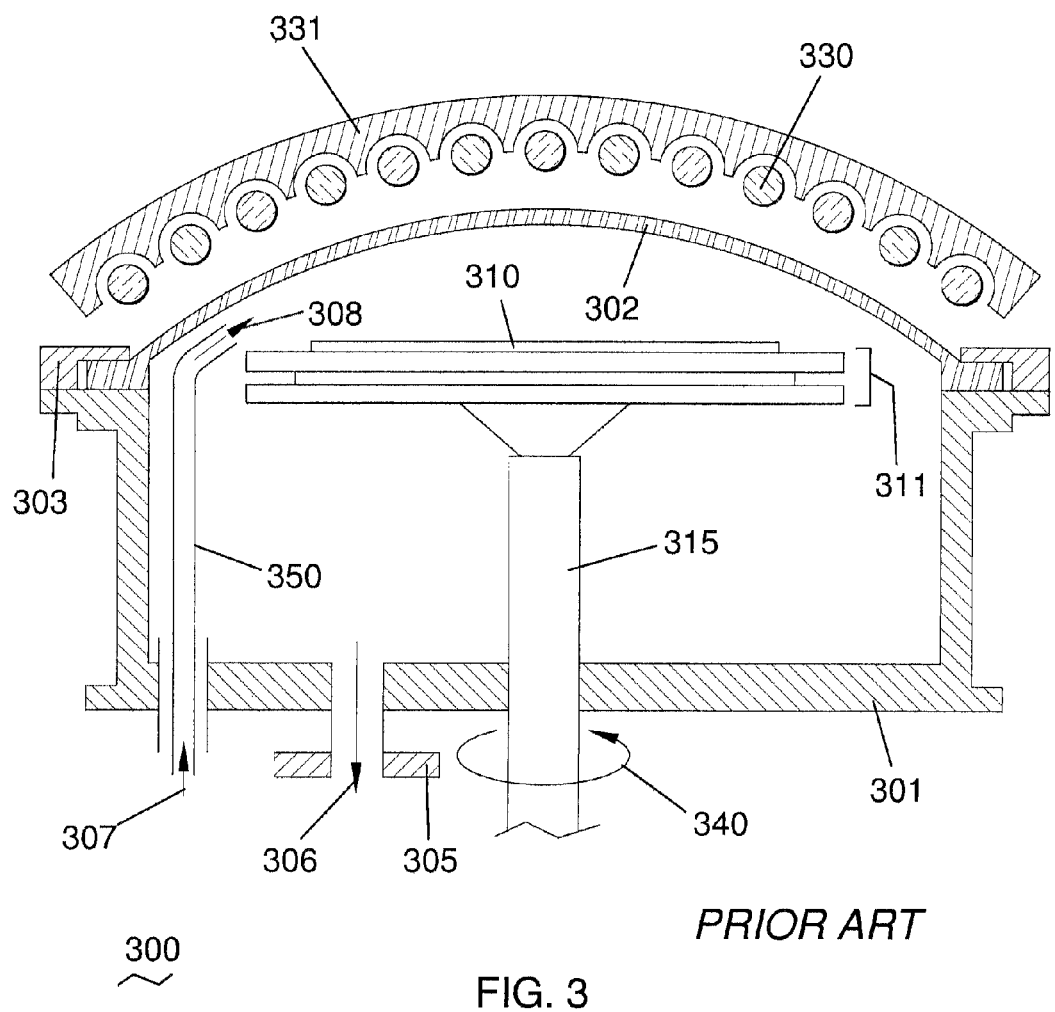
FIG. 3 is a schematic side cross-sectional view of a prior art Single/Mini-Batch™ type epitaxial reactor.

A potential advantage of implementing this four-directional deposition process over the bi-directional process illustrated in FIG. 15 is the opportunity to further enhance the film thickness and resistivity uniformities. The reason for this is that a four-directional deposition process upon stationary wafers will more closely approximate a deposition process in which the wafers are continually rotated during deposition, as was illustrated for all three prior art systems in FIGS. 1-3.

Five Module Epitaxial Reactor with Cross-Flow Processing

Figure 17:
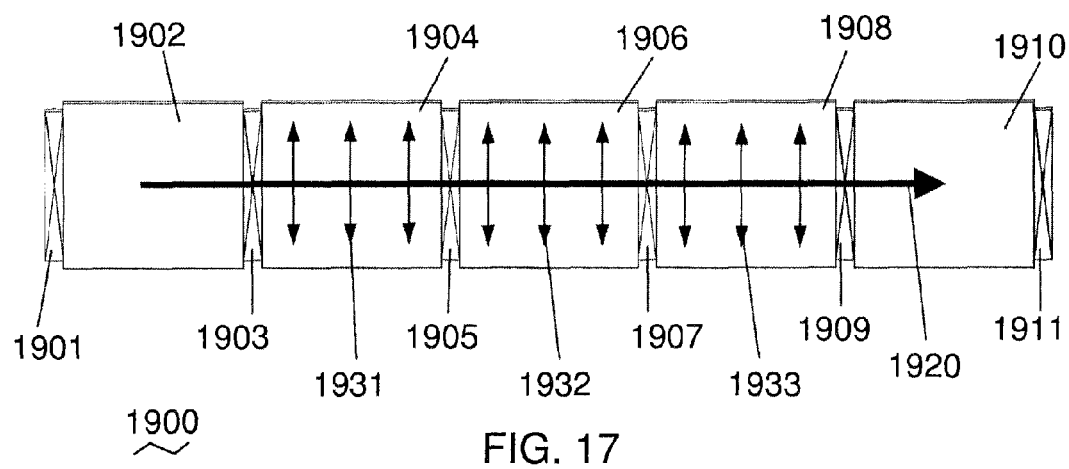
FIG. 17 is a schematic view of a five module epitaxial reactor of the present invention with three reactor modules using cross-flow processing.

A five module epitaxial reactor of another embodiment of the present invention is illustrated in FIG. 17. A wafer sleeve (not shown) loaded with wafers ready for processing is loaded in the direction 1920 through an entrance slit valve 1901 into a preheat chamber 1902. Entrance slit valve 1901 is then closed. The preheat chamber slit valve 1903 must also already have been closed at this point. The wafer sleeve then undergoes a preheat process up to a pre-determined temperature suitable for introduction into a first epitaxial reactor chamber 1904. After the wafer sleeve has reached the proper temperature, the preheat chamber slit valve 1903 is opened to permit transfer of the wafer sleeve from the preheat chamber 1902 into the first epitaxial reactor 1904. The preheat chamber slit valve 1903 is then closed. A first reactor slit valve 1905 may also be closed at this time. Now, a first epitaxial deposition process is initiated within the first epitaxial reactor 1904 until approximately a third of the desired final film thickness has been deposited on the wafers within the wafer sleeve. Next, the first reactor slit valve 1905 is opened to permit transfer of the wafer sleeve into the second epitaxial reactor 1906, after which the first reactor slit valve 1905 may be closed. The second reactor slit valve 1907 may also be closed at this time. A second epitaxial deposition process is then initiated within a second reactor 1906 until approximately another third of the desired final film thickness has been deposited on the wafers within the wafer sleeve. This process repeats again for a third reactor 1908, having a third reactor slit valve 1909, depositing the final third of the total required film thickness on the wafers within the wafer sleeve. If desired, the three depositions may produce the same composition, different dopings, different compositions, or a graded composition.

The third reactor slit valve 1909 is then opened to permit transfer of the hot wafer sleeve into the cool down chamber 1910, after which the third reactor slit valve 1909 is closed. An exit slit valve 1911 must have already been closed at this time to prevent premature venting of the wafer sleeve to air. The wafer sleeve then remains in the cool down chamber 1910 until a low enough temperature for removal has been achieved, after which the exit slit valve 1911 is opened and the wafer sleeve is removed from the epitaxial reactor system. As for the embodiment illustrated in FIG. 15, more than one wafer sleeve may be in transit through the epitaxial reactor system at any one time to achieve optimum throughput. In particular, each of the epitaxial reactors 1904, 1906, 1906 may be simultaneously depositing nearly equally thick layers upon three sequentially presented sets of wafers.

A variant on the design of the epitaxial reactor of FIG. 17 is to replace one or both of the reactor slit valves 1905 and 1907 with valve-free pass-through chambers or passages. This may be possible in cases where the same film composition is being deposited in all three reactors 1904, 1906 and 1908, in which case there is no possibility of cross-contamination between chambers since the process gases and their relative concentrations are the same. This variant may have the advantage of lower costs as well as slightly higher throughputs due to the elimination of valve closing and opening times.

In both the configuration shown in FIG. 17 and the variant with pass-through chambers, cross-flow processing within the three epitaxial reactors is illustrated by the arrows 1931-1933. However, in multiple epitaxial reactors, it is possible to implement some of the reactors without cross flow since counterflow may be introduced between chambers. For cases with odd numbers of reactor chambers, cross-flow processing may generally be necessary in at least one chamber to equalize the deposition thickness occurring using gas flow in each direction. For example, if chamber 1904 has vertical downwards process gas flows, and chamber 1908 has vertical upwards process gas flows, then chamber 1906 might need cross-flow processing with equal amounts of deposition in the upwards and downwards gas flow directions. An advantage of this alternative configuration is the simplification of process gas and exhaust piping for reactor chambers 1904, 1908 since only unidirectional flows would be necessary in these two chambers 1904, 1908. The process gas piping for reactor chamber 1906 in this example would remain the same, however.

Figure 18:
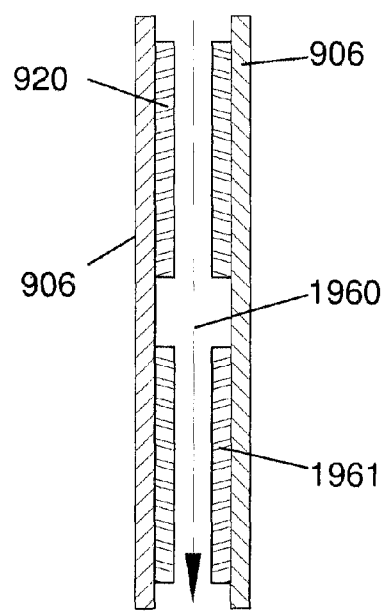
FIG. 18 is a schematic side cross-sectional view of a single-pass cross-flow reactor module of the present invention.

A schematic side cross-sectional view of a single-pass cross-flow reactor module of the present invention is shown in FIG. 18. As the process gas 1960 flows downwards between the wafer carrier plates 906 and wafers 920, boundary layer effects at the surface of each wafer 920 will reduce the velocity of the process gas parallel to the wafer surface, thereby increasing the time available for the epitaxial CVD reaction to occur. As the process gases react on the surfaces of wafers 920, the concentration of process gases will decrease in comparison with the amount of product gases. Thus for wafers 1961 which are farther than the source of process gases, there may be a reduced deposition rate. The cross-flow process is designed to reduce this effect, giving better film thickness and resistivity uniformities.

Six Module Epitaxial Reactor with Optional Cross-Flow Processing

Figure 20:
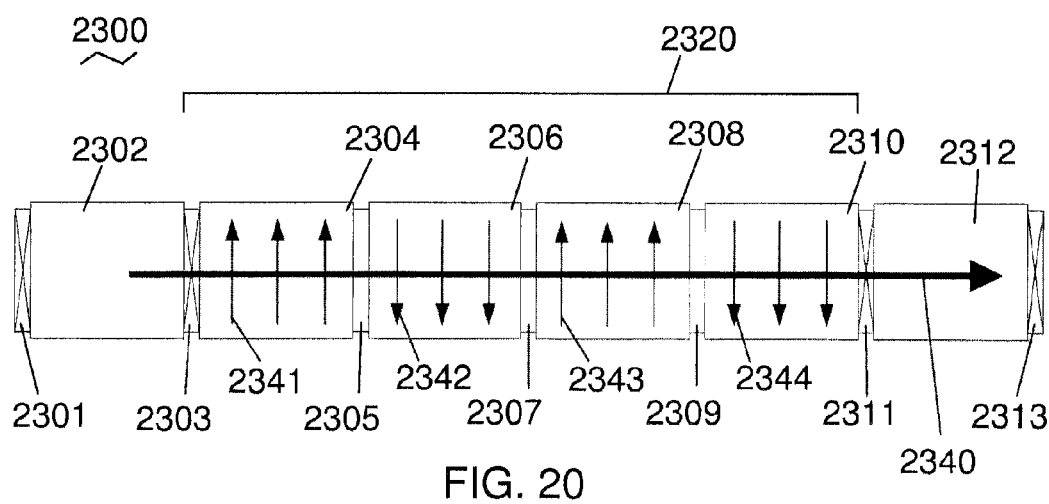
FIG. 20 is a schematic view of a six module epitaxial reactor of the present invention without cross-flow processing.

A six module epitaxial reactor of still another embodiment of the present invention is illustrated in FIG. 20. In this embodiment, four epitaxial reactors 2304, 2306, 2308, and 2310 are separated by Pass-through chambers 2305, 2307 and 2309, not slit valves as was the case for the embodiments illustrated in FIGS. 15 and 17. A wafer sleeve (not shown) containing wafers ready for processing is loaded in the direction 2340 through an entrance slit valve 2301 into a preheat chamber 2302. A preheat chamber slit valve 2303 must already be closed at this point. After the wafer sleeve has reached the proper temperature, the preheat chamber slit valve 2303 is opened to permit transfer of the wafer sleeve from the preheat chamber 2302 into the first epitaxial reactor 2304. The preheat chamber slit valve 2303 is then closed. Now, a first epitaxial deposition process is initiated upon the stationary sleeve within the first reactor 2304 until approximately a fourth of the desired final film thickness has been deposited on the wafers within the wafer sleeve. Concurrently, a second wafer sleeve may be loaded into the preheat chamber 2302 and preheated therein according to the same process accorded the first wafer sleeve. Next, the first wafer sleeve is transferred through the first pass-through chamber 2305 into the second epitaxial reactor 2306. A second epitaxial deposition process is then initiated upon the stationary sleeve within the second reactor 2306 until approximately another fourth of the desired final film thickness has been deposited on the wafers within the wafer sleeve. Concurrently, the second wafer sleeve is transferred from the preheat chamber 2302 to the first epitaxial reactor 230. This process repeats again for the third epitaxial reactor 2308 and the fourth epitaxial reactor 2310, depositing the last two quarters of the desired final film thickness on the wafers within the wafer sleeve. During all deposition processes within reactors 2304, 2306, 2308, and 2310, the reactor slit valve 2311 is closed.

After completion of deposition within the fourth reactor 2310, the fourth reactor slit valve 2311 is opened to permit transfer of the hot wafer sleeve into the cool down chamber 2312, after which the fourth reactor slit valve 2311 is closed. The wafer sleeve then remains in the cool down chamber 2312 until a low enough temperature for removal has been achieved, after which the exit slit valve 2313 is opened and the wafer sleeve is removed from the epitaxial reactor system. Meanwhile multiple wafer sleeves are being processed in the queue. As for the earlier embodiments illustrated in FIGS. 15 and 17, more than one wafer sleeve may be in transit through the epitaxial reactor system at any one time to achieve optimum throughput.

Note that since the epitaxial deposition system illustrated in FIG. 20 has an even number of epitaxial reactor chambers, it may be unnecessary to employ cross-flow processing in any of the epitaxial reactors 2304, 2306, 2308, and 2310 to achieve the desired deposition uniformities. In configurations with an odd number of epitaxial reactors, typically at least one epitaxial reactor will benefit from cross-flow processing in order to achieve equal amounts of deposition in each of the two process gas flow directions. The arrows 2341 in reactor 2304 show that the process gases and purge gas need only enter from the bottom and that the exhaust gases need only be exhausted out the top, thereby substantially simplifying the piping configuration for epitaxial reactor 2304. Similarly, reactor 2306 is shown with arrows 2342 illustrating a vertical downwards process gas and exhaust flow, with similar implications for simplifying the gas and exhaust piping as was the case for reactor 2304. Reactor 2308 has the same flow direction 2343 as reactor 2304, and reactor 2310 has the same flow direction 2344 as reactor 2306. Thus two reactors have each possible flow direction for maximized deposition uniformity without the need for cross-flow processing in any epitaxial reaction chamber. This is in contrast to the likely situation for the epitaxial deposition system illustrated in FIG. 17 with an odd number of epitaxial reactors.

Improving Deposition Uniformity Using Cross-Flow Processing

Figure 19:
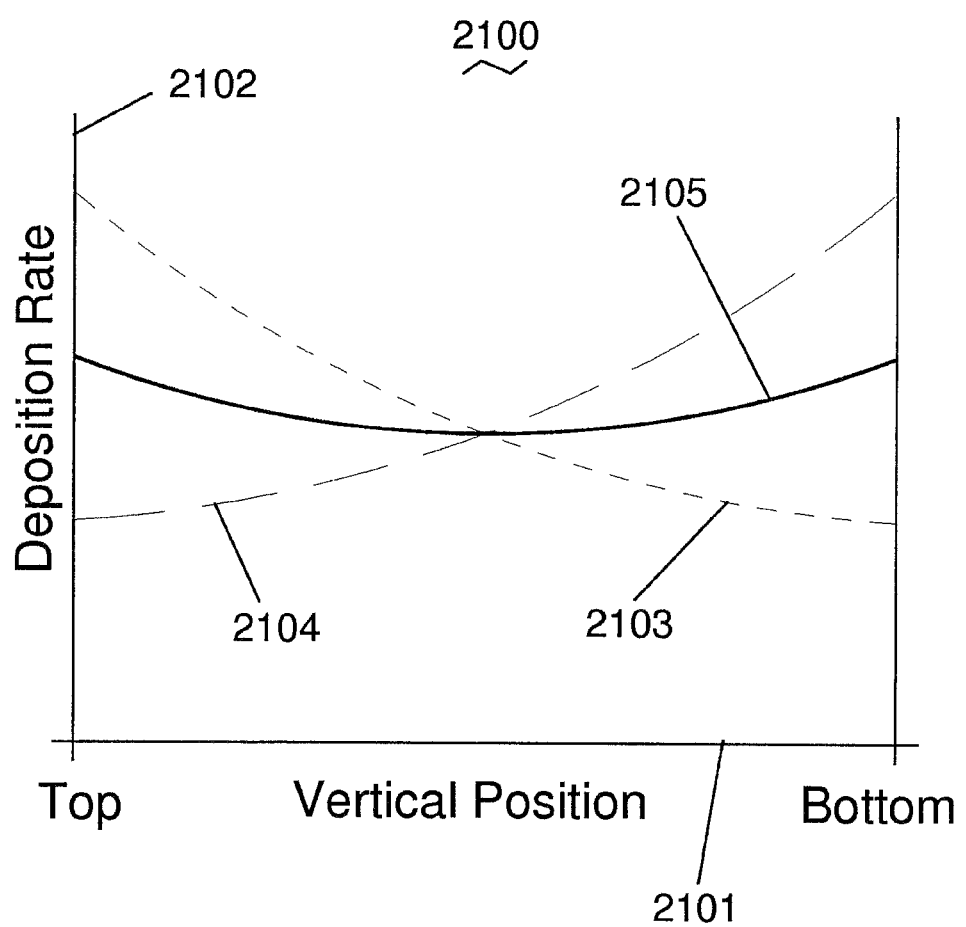
FIG. 19 is a graph of the epitaxial deposition rate against the vertical position within the reactor module.

A graph of the epitaxial deposition rate 2102 against the vertical position 2101 within the reactor module is shown in FIG. 19. As discussed above for FIG. 18, when the process gases are flowing vertically downwards within the wafer sleeve, the deposition rate will be higher for wafers nearer the top of the wafer sleeve and lower for wafers nearer the bottom of the wafer sleeve, as shown by the short-dashed curve 2103. Conversely, when the process gases are flowing vertically upwards within the wafer sleeve, the deposition rate will be higher for wafers nearer the bottom of the wafer sleeve and lower for wafers nearer the top of the wafer sleeve, as shown by the long-dashed curve 2104. Since the two deposition rate curves 2103, 2104 are independent, i.e., there is no interaction between the two operating modes, and if the two modes are employed equal amounts of time, the net deposition rate on the wafers within the wafer sleeve will be the arithmetic mean 2105 of the two curves 2103, 2104. Note that the mean deposition rate curve 2105 shows a greatly improved uniformity top to bottom within the wafer sleeve, however, complete top-to-bottom uniformity would only be achievable if the individual curves are roughly linear, which is not generally the case.

Improving Deposition Uniformity Using Lamp Sequencing

Observation of the schematic top-down process flow deposition rate curve 2103 in FIG. 19 shows that the deposition rate is highest at the top of the reactor, near the process gas inlet where the concentration of reactants is highest. Progressing downwards, the deposition rate decreases as expected since the concentrations of reactants will be depleted by the deposition processes on the wafers above. If the decrease in deposition rate were linear, however, i.e., if the top-down curve 2103 and the bottom-up curve 2104 were straight lines, then the combined average deposition rate curve 2105 might be near to a highly uniform constant deposition rate independent of vertical position within the wafer sleeve. As shown in FIG. 19, however, since the top-down curve 2103 and the bottom-up curve 2104 both tend to beconcave upwards, the average deposition rate curve 2105 is also concave, giving higher average deposition rates near the top and bottom of the reactor. To further improve the film thickness and resistivity uniformities, an additional process called "lamp sequencing" may be employed to further improve within wafer and wafer-to-wafer uniformities by real-time control of the illumination intensities of the lamps within the lamp modules used to heat the wafer sleeve. A lamp sequencing procedure within a single pass reactor module of the present invention is shown in the schematic cross-sectional views of FIGS. 21A-C.

Figures 21A, 21B, 21C:
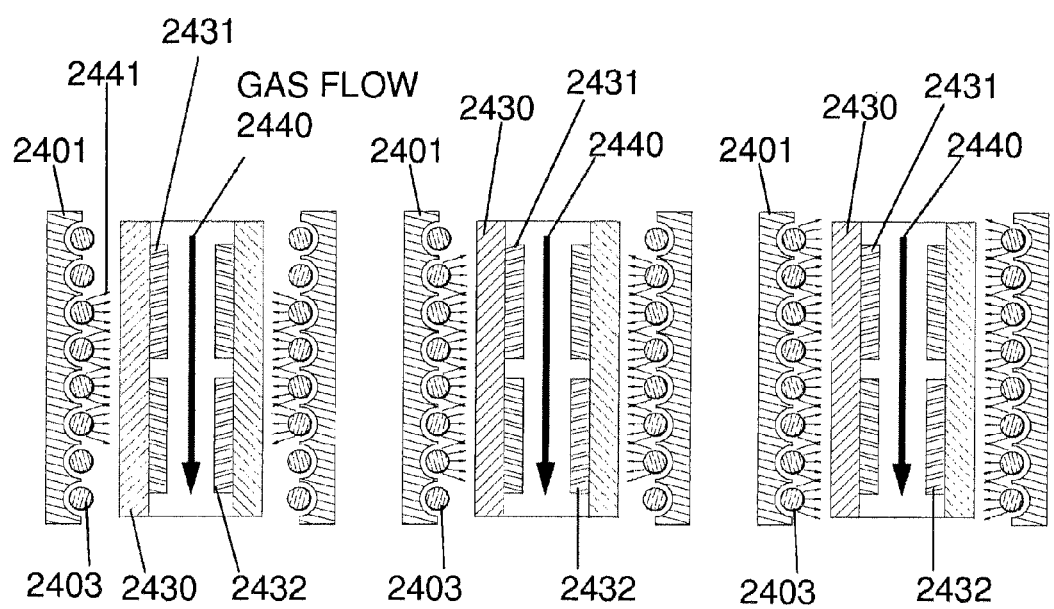
FIG. 21A is a schematic cross-sectional view of a single-pass reactor module of the present invention at a first time within an epitaxial deposition process utilizing a lamp sequencing procedure.
FIG. 21B is a schematic cross-sectional view of a single-pass reactor module of the present invention at a time after the time illustrated in FIG. 21A.
FIG. 21C is a schematic cross-sectional view of a single-pass reactor module of the present invention at a time after the time illustrated in FIG. 21B.

All of the curves in FIG. 19 assume that all the lamps 2403 are on all the time, uniformly heating the wafer carrier plates 2430 and thus the wafers 2431 attached thereto. If the lamps 2403 are configured with independent controls and power supplies, however, this need not be the case, as illustrated in FIGS. 21A-B. To "straighten" the top-down and bottom-up deposition curves in FIG. 19, the deposition rates near the tops and bottoms of the wafer sleeve may be changed with respect to the deposition rate at the center of the wafer sleeve be thermally varying the radiant intensity across the vertical direction by differentially powering the different lamps 2403. On the other hand, conventional lamps 2403 produce a uniform radiant intensity along their respective lengths.

The view in FIG. 21A is near the beginning or other point of wafer processing. Two arrays of independently controllable lamps 2403 are mounted facing towards the wafer sleeve comprising two wafer carrier plates 2430, with each array of lamps mounted within a respective reflector assembly 2401. The wafers 2431 are attached with good thermal contact to the wafer carrier plates 2430. The process gas flow direction 2440 is shown downwards although the lamp sequencing procedure works equally well with an upward process gas flow direction. High intensity illumination 2441 from the four center lamps 2403 within the lamp module, that is, the most distant lamps from the two source of process gas, is shown preferentially heating the center region of the wafer sleeve. Since the rates of epitaxial deposition are highly temperature sensitive, reducing the temperatures of the tops and bottoms of the wafer carrier plates 2430 can substantially affect the deposition rates for the wafers 2431 near the tops and bottoms of the wafer carrier plates 2430 compared with the deposition rates near the centers of the wafer carrier plates 2430.

At a later or different period during deposition, some lamps nearer the top and bottom of the wafer carrier plates 2430 nearer the sources of process gas may be turned on as shown in FIG. 21B, where illumination 2441 from the center four lamps may continue at the same level as in FIG. 21A while additional illumination 2450 has been added to increase the energy flux into the upper and lower portions of the wafer carrier plates 2430. Finally, or in a different period during deposition, all lamps 2403 may be turned on as illustrated in FIG. 21C, where illumination 2460 from the top and bottom lamps 2430 has been added to the pre-existing illumination 2441 and 2450 to now fully heat the wafer carrier plates 2430 from top to bottom. That is, the linear distribution of radiation across the vertical axis of the wafers may be varied during deposition but the radiation remains substantially constant in the horizontal direction at a given vertical position because of the linear nature of the lamps.

Figure 22:
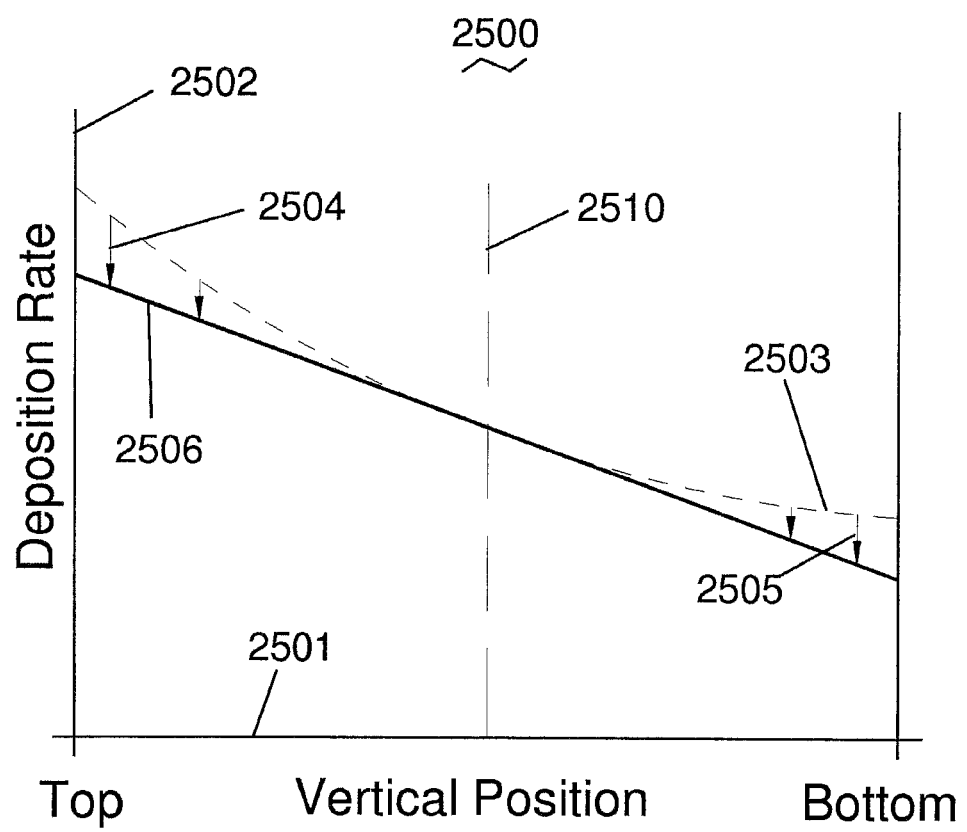
FIG. 22 is a graph illustrating how the lamp sequencing procedure shown in FIGS. 21A-C may linearize the variation in epitaxial deposition rate against the vertical position within the reactor module.

FIG. 22 is a graph illustrating how the lamp sequencing procedure shown in FIGS. 21A-C may modify the epitaxial deposition rate against the vertical position within the wafer sleeve. Short-dashed curve 2503 is the same as the short-dashed top-down process gas flow curve 2103 in FIG. 19. The downward arrows 2504 at the left represent the decreased deposition rate near the top of the wafer sleeve due to the decreased duty cycle of the top lamp lamps 2403 relative to the center lamps 2403 while the downward arrows 2505 at the right represent the decreased deposition rate near the bottom of the wafer sleeve due to the decreased duty cycle of the bottom lamps 2403. With proper calibration of the lamp sequencing procedure of FIGS. 21A-C, the linearity of the adjusted deposition rate 2506 may be improved. For each type of deposition process, the proper lamp sequencing procedure must be determined since rates of process gas consumption with flow across the wafers may differ. Note that although lamp sequencing may improve the linearity of the deposition rate as a function of distance from the top of the reactor, it alone is often insufficient to achieve process uniformity. For this, cross-flow processing may also be necessary in conjunction with lamp sequencing as illustrated in FIG. 23.

Figure 23:
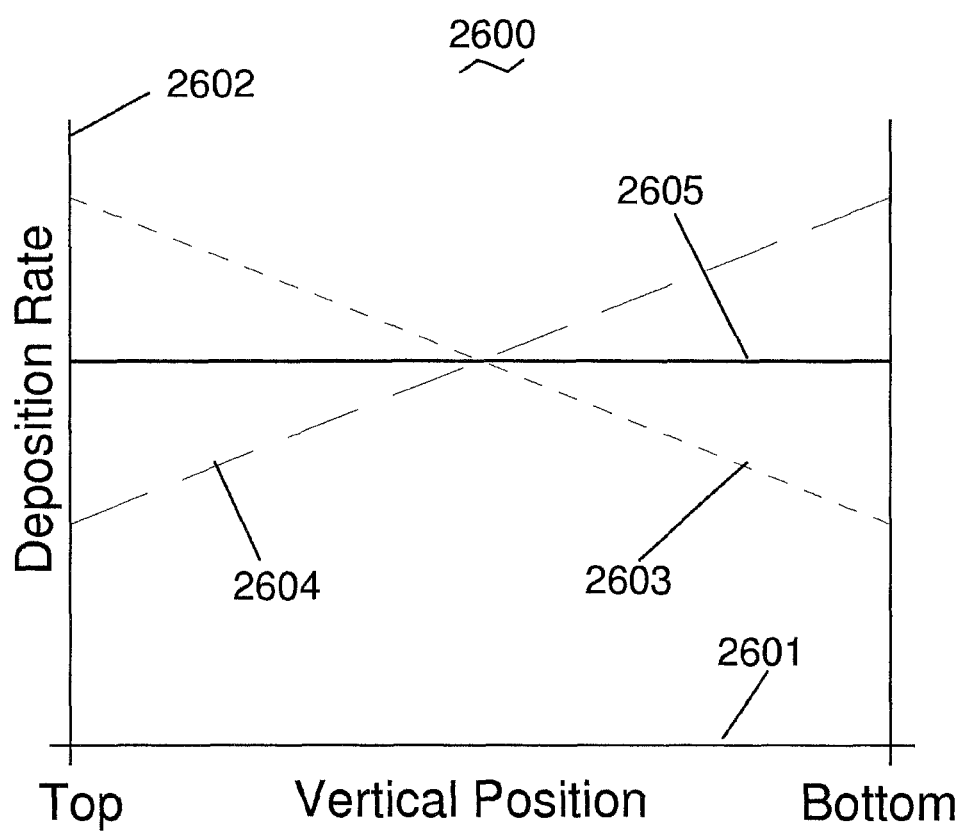
FIG. 23 is a graph of the epitaxial deposition rate against the vertical position within the reactor module utilizing a lamp sequencing procedure combined with cross-flow processing to improve uniformity.

A graph is shown in FIG. 23 of the epitaxial deposition rate 2602 against the vertical position 2601 within the wafer sleeve utilizing a lamp sequencing procedure combined with cross-flow processing to improve uniformity. The deposition rate as a function of vertical position within the wafer sleeve for top-down process gas and exhaust flows is shown as a short-dashed curve 2603 descending from the upper left. The deposition rate for bottom-up flows is shown as a long-dashed curve 2604 ascending from the lower left. Note that lamp sequencing has been used to linearize both these curves. By employing cross-flow processing for equal times, the average deposition rate is the arithmetic mean 2605 of the top-down curve 2603 and the bottom-up curve 2304. Comparison of this average deposition rate curve 2605 with the concave average deposition rate curve 2105 in FIG. 19 shows the possible improvement in uniformity achievable with a combination of both lamp sequencing and cross-flow processing.

Alternative Method of Lamp Sequencing

Figure 24:
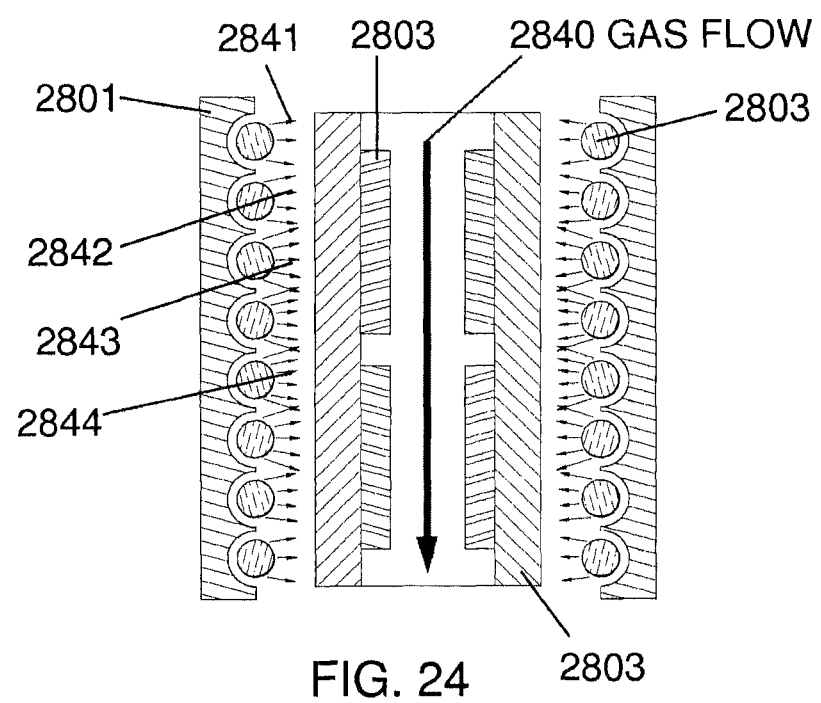
FIG. 24 is a schematic cross-sectional view of a single-pass reactor module of the present invention using varying lamp intensities from top to bottom of the lamp module in order to linearize the epitaxial deposition rate.

The lamp sequencing method described in FIGS. 21A-C employed an on/off lamp control methodology to linearize the deposition rate variation from the top to the bottom of the wafer sleeve. An alternative approach for deposition rate linearization is illustrated in FIG. 24. Two arrays of independently controllable lamps 2803 are mounted within respective reflector assemblies 2801 facing towards the wafer sleeve and its two wafer carrier plates 2830. The wafers 2803 are attached with good thermal contact to the wafer carrier plates 2830. The process gas flow direction 2840 is shown downwards, although the alternative lamp sequencing procedure works equally well with an upward process gas flow direction. The difference between the lamp sequencing procedure described in this section compared with the sequence in FIGS. 21A-C is the use of variable light intensities instead of on/off lamp control by powering different lamps in the array with variable levels of finite power.

In the example of FIG. 24, the outer two lamps have a low illumination level 2841, the next two lamps inwards have a slightly higher illumination level 2842, the next two lamps inwards have an even higher illumination level 2843, while the center two lamps have the highest illumination level 2844 of all. This illumination profile will cause the vertical centers of the wafer carrier plates 2830 to be somewhat hotter than the tops and bottoms. In this case, in contrast with FIGS. 21A-C, there may be no need for time variation in the lamp intensities. Thus the varying lamp brightnesses shown in FIG. 24 may be sustained throughout the entire epitaxial deposition cycle. It may also be desirable to combine the lamp sequencing methods from FIGS. 21A-C with the method from FIG. 24.

It will be understood by those skilled in the art that the foregoing descriptions are for illustrative purposes only. A number of modifications to the above epitaxial reactor design and system configuration are possible within the scope of the present invention, such as the following.

The invention is not limited to epitaxial deposition but may be applied to deposition of polycrystalline or amorphous layers. Although the invention is particularly useful with monocrystalline silicon substrates, the substrates may be composed of other material and have different crystalline structure. Further, the invention may be applied to other semiconductor structures including electronic integrated circuits.

The epitaxial reactor may be configured with one, two, or more than two lamp modules illuminating a multi-sided wafer sleeve.

The epitaxial reactor orientation may be changed to embody process gas flow, purge gas flow, and exhaust pumping along a non-vertical axis. The ports for the process gas, purge gas, and exhaust may be on the same side of the reactor chamber.

Wafers within the wafer sleeve may be attached with good thermal contact to the carrier plates of the wafer sleeve using a number of clamping schemes other than shoulder screws.

Cooling of the lamps within the lamp module may be effected using gases other than air. For example a non-oxidizing gas might be used to reduce the possibility of oxidative damage to the reflectors within the lamp module.

Various numbers of lamps within each lamp module are possible other than the numbers of lamps shown in the schematic illustrations herein.

A number of water cooling channel configurations within the lamp module are possible, other than the serpentine pattern shown herein.

The wafer sleeve may be configured with carrier plates having integral end caps, thereby eliminating the need for separate end caps and reducing parts count.

The illumination window may be fabricated from a clear material other than quartz, and with thicknesses differing from a range near 10 mm.

The overall epitaxial reactor system may be configured with a number of reactor modules different from the quantities illustrated in the embodiments herein. In addition, the epitaxial reactor system may be configured without a preheat chamber, or possibly without a cool down chamber, wherein the heat-up and cool-down functions performed by these modules in the embodiments shown herein could be performed by chambers which are separated from the epitaxial reactor system.

The lamp sequencing procedure may employ more complex illumination strategies to linearize the deposition rates in cases where the variation in deposition rate along the direction of process gas and exhaust flows is more complex than a simple concave curve.

In systems with multiple numbers of reactors, it is possible to employ a lamp sequencing procedure in successive reactors wherein the process flows have different directions, instead of using cross-flow processing within each reactor.

The orientations of the lamps within lamp modules attached to different reactor modules may be different.

What is claimed is:

1. A chemical vapor deposition reactor for simultaneously depositing from a precursor gas thin films on a multiplicity of wafers comprising:

a first lamp module, comprising
  a first multiplicity of lamps, and
  a first reflector assembly; and
a wafer sleeve configured for enclosing said multiplicity of wafers, comprising a pair of wafer carrier plates to which the multiplicity of wafers are attachable to interior surfaces of both of said first pair of wafer carrier plates by mounting structures, and
  two end caps, said pair of wafer carrier plates being detachably attached to said two end caps, said two end caps determining the spacing between inner surfaces of said pair of wafer carrier plates, said pair of wafer carrier plates being parallel and said inner surfaces being opposed, and wherein said two end caps and said pair of wafer carrier plates form a processing cavity, said processing cavity being closed on first opposing ends by said end caps and open on second opposing ends; and
a first illumination window;
a reactor frame for supporting said first lamp module, wherein said first illumination window is fixed between said first lamp module and said reactor frame;
a first inlet for process gas into said wafer sleeve disposed on a first side of said reactor frame; and
a first outlet for exhausting gas disposed on a second side of said reactor frame wherein said second side of said reactor frame is on an opposite side of said wafer sleeve from said first side of said reactor frame;
wherein said wafer sleeve is transportable into the reactor and exposable to said first lamp module within the reactor and, after completion of said deposition of a thin film on the multiplicity of wafers, is removable from the reactor with the wafers, and wherein each one of the pair of wafer carrier plates is configured for the attachment of at least two of said multiplicity of wafers along a direction of as flow from said first gas inlet to said first gas outlet.

2. The reactor of claim 1, further comprising:
a second lamp module, comprising
  a second multiplicity of lamps, and
  a second reflector assembly; and
a second illumination window;
wherein said second illumination window is fixed between said second lamp module and said reactor frame on an opposite side from said first lamp module.

3. The reactor of claim 2, wherein the lamps linearly extend in a first direction in parallel to the wafer carrier plates.

4. The reactor of claim 3, further comprising a source of cooling gas for flowing a cooling gas in the first direction along each of the lamps in said lamp modules.

5. The reactor of claim 4, wherein the source of cooling gas is directed to axially middle portions of the lamps and further comprising two exhaust ports disposed respectively near opposite ends of the lamps.

6. The reactor of claim 3, wherein the lamps are capable of being differentially powered to provide different levels of radiation.

7. The reactor of claim 1, further comprising a source of cooling liquid coupled to said reactor frame.

8. The reactor of claim 1, further comprising:
a second inlet for process gas into said wafer sleeve disposed on said second side of said reactor frame; and
a second outlet for exhausting gas from said first side of said reactor frame, thereby allowing alternating directions of flow of the process gas through the sleeve.

9. The reactor of claim 1, further comprising at least one inlet for introducing purge gas disposed on said first side of said reactor frame generally into a space within the reactor frame exterior to the wafer sleeve.

10. The reactor system of claim 1, wherein said mounting structures are screws.

11. A reactor system for simultaneously depositing thin films on a multiplicity of wafers, comprising:
 a wafer sleeve configured for enclosing said multiplicity of wafers, comprising a pair of wafer carrier plates to which the multiplicity of wafers are attachable to interior surfaces of both of said pair of wafer carrier plates by mounting structures, and
  two end caps, said pair of wafer carrier plates being detachably attached to said two end caps, said two end caps determining the spacing between inner surfaces of said pair of wafer carrier plates, said pair of wafer carrier plates being parallel and said inner surfaces being opposed, and wherein said two end caps and said pair of wafer carrier plates form a processing cavity, said processing cavity being closed on first opposing ends by said end caps and open on second opposing ends; and
 a reactor chamber for removably accommodating the wafer sleeve,
 planar heat sources associated with first and second walls of the chamber on either side of the accommodated wafer sleeve,
 a first process gas inlet positioned on a third wall of the chamber and directed to the first open end of the wafer sleeve; and
 a first exhaust port positioned on a fourth wall of the chamber opposite the first wall;
 wherein each one of the pair of wafer carrier plates is configured for the attachment of at least two of said multiplicity of wafers along a direction of gas flow from said first process gas inlet to said first exhaust port.

12. The reactor system of claim 11, further comprising:
 a second process gas inlet positioned on the fourth wall of the chamber and directed to the second open end; and
 a second exhaust port positioned on the third wall of the chamber.

13. The reactor system of claim 11, wherein the heat sources comprise respective lamp arrays of incandescent lamps linearly extending between the third and fourth walls respectively along the first and second walls of the chamber and further comprising:
 two illumination windows respectively positioned between the lamp arrays and the accommodated wafer sleeve; and
 a source of a purge gas to a region of reactor chamber between the illumination windows and the accommodated wafer sleeve.

14. The reactor system of claim 11, wherein said mounting structures are screws.

15. A reactor system for simultaneously depositing thin films on a multiplicity of wafers, comprising:
 a wafer sleeve configured for enclosing said multiplicity of wafers, comprising a pair of wafer carrier plates to which the multiplicity of wafers are attachable to interior surfaces of both of said pair of wafer carrier plates by mounting structures, and
  two end caps, said pair of wafer carrier plates being detachably attached to said two end caps, said two end caps determining the spacing between inner surfaces of said pair of wafer carrier plates, said pair of wafer carrier plates being parallel and said inner surfaces being opposed, and wherein said two end caps and said pair of wafer carrier plates form a processing cavity, said processing cavity being closed on first opposing ends by said end caps and open on second opposing ends; and
 a reactor chamber for removably accommodating the wafer sleeve,
 planar heat sources associated with first and second walls of the chamber on either side of the accommodated wafer sleeve,
 a first process gas inlet positioned on a third wall of the chamber and directed to the first open end of the wafer sleeve;
 a first exhaust port positioned on a fourth wall of the chamber opposite the first wall;
 a preheating module, configured to heat the wafer sleeve up to a proper temperature for processing in the first reactor chamber; and
 a cool down module, configured to reduce a temperature of the wafer sleeve after processing in the first reactor chamber;
 wherein the wafer sleeve is linearly transportable between the preheating module, the first reactor chamber and the cool down module, and wherein
 said preheating module, said cool down module and said reactor chamber are physically separate.

16. The reactor system of claim 15, further comprising a slit valve between said preheat module and said reactor chamber.

17. The reactor system of claim 15, further comprising a slit valve between said reactor chamber and said cool down module.

* * * * *